US009449699B2

(12) United States Patent
Nam et al.

(10) Patent No.: US 9,449,699 B2
(45) Date of Patent: Sep. 20, 2016

(54) NONVOLATILE MEMORY AND ERASING METHOD THEREOF

(71) Applicant: SAMSUNG ELECTRONICS CO., LTD., Suwon-si, Gyeonggi-do (KR)

(72) Inventors: Sang-Wan Nam, Hwaseong-si (KR); Won-Taeck Jung, Hwaseong-si (KR); Junghoon Park, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/009,856

(22) Filed: Jan. 29, 2016

(65) Prior Publication Data

US 2016/0148698 A1 May 26, 2016

Related U.S. Application Data

(60) Division of application No. 14/644,247, filed on Mar. 11, 2015, now Pat. No. 9,281,070, which is a continuation of application No. 14/485,049, filed on Sep. 12, 2014, now Pat. No. 8,982,642, which is a division of application No. 13/597,534, filed on Aug. 29, 2012, now Pat. No. 8,837,228.

(30) Foreign Application Priority Data

Sep. 30, 2011 (KR) .................. 10-2011-0099914

(51) Int. Cl.
*G11C 16/16* (2006.01)
*G11C 16/14* (2006.01)
*G11C 16/04* (2006.01)
*G11C 16/08* (2006.01)

(52) U.S. Cl.
CPC .......... *G11C 16/14* (2013.01); *G11C 16/0483* (2013.01); *G11C 16/08* (2013.01); *G11C 16/16* (2013.01)

(58) Field of Classification Search
CPC ... G11C 16/16; G11C 16/14; G11C 16/3445; G11C 16/344; H01L 27/115
USPC ................. 365/185.29, 218, 185.11, 230.03
See application file for complete search history.

(56) References Cited

U.S. PATENT DOCUMENTS

| 6,295,227 B1 | 9/2001 | Sakui et al. |
| 8,004,900 B2 | 8/2011 | Dutta et al. |
| 2002/0136057 A1* | 9/2002 | Akaogi .............. G11C 5/145 365/185.11 |
| 2010/0006922 A1 | 1/2010 | Matsuoka et al. |
| 2010/0159657 A1 | 6/2010 | Arai et al. |

* cited by examiner

*Primary Examiner* — Jason Lappas
(74) *Attorney, Agent, or Firm* — Volentine & Whitt, PLLC

(57) ABSTRACT

An erase method of a nonvolatile memory includes supplying an erase voltage to a substrate, supplying a selection word line voltage to word lines connected with a selected sub-block within a memory block of the nonvolatile memory, supplying a non-selection word line voltage to word lines connected with an unselected sub-block within the memory block during a first delay time from a point of time when the erase voltage is supplied, and thereafter floating the word lines connected with the unselected sub-block.

30 Claims, 28 Drawing Sheets

Fig. 10

| | Control Voltage |
|---|---|
| SSL | Float |
| WLS of Selected Sub Block | Vsw(Vss) |
| WLS of Unselected Sub Block | Vusw(Vss) → Float |
| DWL | Vdw(Vss) → Float |
| GSL | Vgsl(Vss) → Float |
| Substrate | Vers |

Fig. 21

| | Control Voltage |
|---|---|
| SSL | Float |
| WLS of 3rd Sub-Block(Unselected) | WL6 : Float<br>WL5 : Vusw → Float |
| WLS of 2nd Sub-Block(Selected) | Vsw |
| WLS of 1st Sub-Block(Unselected) | Vusw → Float |
| DWL | Vdw → Float |
| GSL | Vgsl → Float |
| Substrate | Vers |

Fig. 22

| | Control Voltage |
|---|---|
| SSL | Float |
| WLS of 3rd Sub-Block(Unselected) | Vusw → V2 |
| WLS of 2nd Sub-Block(Selected) | Vsw |
| WLS of 1st Sub-Block(Unselected) | Vusw → V1 |
| DWL | Vdw → Float |
| GSL | Vgsl → Float |
| Substrate | Vers |

Fig. 24

| | Control Voltage |
|---|---|
| SSL | Float or<br>Vssl → Float |
| DWL3 | Float or<br>Vdw → Float |
| WLS of 2nd<br>Sub-Block(Selected) | Vsw |
| DWL2 | Vdw → Float |
| WLS of 1st<br>Sub-Block(Unselected) | Vusw → Float |
| DWL1 | Vdw → Float |
| GSL | Vgsl → Float |
| Substrate | Vers |

Fig. 25

| | Control Voltage |
|---|---|
| SSL | Float or<br>Vssl → Float |
| DWL3 | Float or<br>Vdw → Float |
| WLS of 2nd<br>Sub-Block(Unselected) | Float or<br>Vusw → Float |
| DWL2 | Float or<br>Vdw → Float |
| WLS of 1st<br>Sub-Block(Selected) | Vsw |
| DWL1 | Vdw → Float |
| GSL | Vgsl → Float |
| Substrate | Vers | ific levels, respectively.
NONVOLATILE MEMORY AND ERASING METHOD THEREOF

CROSS-REFERENCE TO RELATED APPLICATIONS

This is a Divisional of application Ser. No. 14/644,247, filed Mar. 11, 2015, which is a Continuation of application Ser. No. 14/485,049, filed Sep. 12, 2014, which issued as U.S. Pat. No. 8,982,642, on Mar. 17, 2015, and which is a Divisional of application Ser. No. 13/597,534, filed Aug. 29, 2012, which issued as U.S. Pat. No. 8,837,228, and in which a claim of priority under 35 U.S.C §119 is made to Korean Patent Application No. 10-2011-0099914 filed Sep. 30, 2011, the entirety of which is incorporated by reference herein.

BACKGROUND

Embodiments relate to a semiconductor memory device, and more particularly, to a memory system including a nonvolatile memory.

A semiconductor memory device is a memory device which is fabricated at least partially from semiconductors such as silicon (Si), germanium (Ge), gallium arsenide (GaAs), indium phosphide (InP), and the like. Semiconductor memory devices are generally categorized as either volatile memory devices or nonvolatile memory devices.

The volatile memory devices are usually characterized by the loss of stored data when power is interrupted or otherwise disconnected. Examples of volatile memory devices include certain types of random access memory (RAM) such as static RAM (SRAM), dynamic RAM (DRAM), synchronous DRAM (SDRAM), and the like. The nonvolatile memory devices may retain stored contents even at power-off. Nonvolatile memory devices, on the other hand, are usually characterized by the retention of stored data when power is interrupted. Examples of nonvolatile memory include read only memory (ROM), programmable ROM (PROM), electrically programmable ROM (EPROM), electrically erasable and programmable ROM (EEPROM), flash memory device (e.g., NAND type and NOR type), phase-change RAM (PRAM), magnetic RAM (MRAM), resistive RAM (RRAM), ferroelectric RAM (FRAM), and the like.

Typically, the memory cell array of a semiconductor memory device extends in two dimensions with memory cells located at intersecting rows and columns. Recently, however, semiconductor memory devices having a three-dimensional array structure have been developed to enhance integration densities.

SUMMARY

One aspect of embodiments of the inventive concept is directed to provide an erase method of a nonvolatile memory which includes a substrate and a memory block, the memory block having a plurality of sub-blocks stacked on the substrate. The erase method includes supplying an erase voltage to the substrate, supplying a selection word line voltage to word lines connected with a selected sub-block within the memory block, and, after supplying a non-selection word line voltage to word lines connected with an unselected sub-block within the memory block during a first delay time from a point of time when the erase voltage is supplied, floating the word lines connected with the unselected sub-block.

In this embodiment, the unselected sub-block may be placed between the selected sub-block and the substrate.

In this embodiment, the at least one memory block may further include dummy memory cells connected with a dummy word line. The erase method may further include, after supplying a dummy word line voltage to the dummy word line during a second delay time from a point of time when the erase voltage is supplied, floating the dummy word line.

In this embodiment, the dummy memory cells may be disposed to be closer to the substrate than the selected sub-block and the unselected sub-block, and the second delay time is shorter than the first delay time.

In this embodiment, the dummy memory cells may be disposed to be closer to the substrate than the selected sub-block and the unselected sub-block, and the memory block may further include ground selection transistors which are disposed between the dummy memory cells and the substrate and are connected to a ground selection line. The erase method may further include, after supplying a ground selection line voltage to the ground selection line during a third delay time from a point of time when the erase voltage is supplied, floating the ground selection line.

In this embodiment, the third delay time may be shorter than the second delay time, and the second delay time is shorter than the first delay time.

In this embodiment, the first through third times may be times taken for the erase voltage to reach corresponding specific levels, respectively.

In this embodiment, the unselected sub-block may be disposed between the selected sub-block and the substrate, and the at least one memory block may further include a second unselected sub-block located farther from the substrate than the selected sub-block.

In this embodiment, the erase method may further include floating word lines connected with the second unselected sub-block when the erase voltage is supplied.

In this embodiment, the erase method may further include, after supplying the non-selection word line voltage to word lines connected with the second unselected sub-block during a second delay time from a point of time when the erase voltage is supplied, floating the word lines connected with the second unselected sub-block.

In this embodiment, the erase method may further include floating ones of word lines connected with the second unselected sub-block when the erase voltage is supplied, and, after supplying the non-selection word line voltage to the others of the word lines connected with the second unselected sub-block during a second delay time, floating the others of the word lines.

In this embodiment, the at least one memory block may further include string selection transistors which are connected with a string selection line and are placed to be far from the substrate than the plurality of sub-blocks. The erase method may further include, after supplying a string selection line voltage to the string selection line during a second delay time from a point of time when the erase voltage is supplied, floating the string selection line.

Another aspect of embodiments of the inventive concept is directed to provide a nonvolatile memory including a memory cell array including a substrate and a memory block, the memory block having a plurality of sub-blocks stacked on the substrate. The nonvolatile memory further includes an address decoder connected with the memory cell array via a plurality of word lines, and a voltage generator configured to generate an erase voltage. The address decoder is configured to float word lines connected with an unselected sub-block of the memory block, after supplying a non-selection word line voltage to the word lines connected with the unselected sub-block until a delay time elapses from a point of time when the erase voltage is supplied.

In this embodiment, the address decoder may be further configured to supply a selection word line voltage to word lines connected with a selected sub-block of the memory block when the erase voltage is supplied.

In this embodiment, the unselected sub-block may be located between the selected sub-block and the substrate.

Another aspect of embodiments of the inventive concept is directed to provide a nonvolatile memory which includes a three-dimensional (3D) memory cell array. The 3D memory cell array includes a substrate and a memory block, the memory block including an array of memory cell strings extending vertically over the substrate. The memory block includes first and second sub-blocks stacked over the substrate such that the first sub-block includes a first sub-set of memory cells of each memory cell string and the second sub-block includes a second sub-set of memory cells of each memory cell string. The nonvolatile memory further includes an address decoder connected with the memory cell array via a plurality of word lines, and a voltage generator configured to generate an erase voltage supplied to the substrate during an erase operation of a selected sub-block among the first and second sub-blocks. The address decoder is configured to supply a selection word line voltage to word lines connected with the selected sub-block among the first and second sub-blocks, to supply a non-selection word line voltage to word lines connected with an unselected sub-block among the first and second sub-blocks during a first delay time from a point of time when the erase voltage is supplied, and to float the word lines connected with the unselected sub-block after supplying the non-selection word line voltage.

In this embodiment, the first sub-block may be located between the substrate and the second sub-block, and the first sub-block may be the unselected sub-block and the second sub-block may be the selected sub-block.

In this embodiment, each memory cell string may include a string selection transistor connected between a bit line and the memory cells of the memory cell string, a ground selection transistor connected to a common source line, and a dummy memory cell connected between ground selection transistor and the memory cells of the memory cell string.

In this embodiment, the address decoder may be further configured to supply a dummy word line voltage to a dummy word line of the dummy memory cell during a second delay time from a point of time when the erase voltage is supplied, and to float the dummy word line after supplying the dummy word line voltage, where the second delay time is shorter than the first delay time.

In this embodiment, the address decoder may be further configured to supply a ground selection line voltage to the ground selection line during a third delay time from a point of time when the erase voltage is supplied, and to float the ground selection line after supplying the ground selection line voltage, where the third delay time is shorter than the second delay time.

BRIEF DESCRIPTION OF THE FIGURES

The above and other objects and features will become apparent from the detailed description that follows with reference to the accompanying figures, wherein like reference numerals refer to like parts throughout the various figures unless otherwise specified.

FIG. 10 is a table showing a bias condition in the event that memory cells of a memory block are included within two sub-blocks.

FIG. 21 is a table illustrating still another embodiment of a bias condition in the event that memory cells of a memory block are included within three sub-blocks.

FIG. 22 is a table illustrating still another embodiment of a bias condition in the event that memory cells of a memory block are included within three sub-blocks.

FIG. 24 is a table illustrating a bias condition on an equivalent circuit of FIG. 23 when a first sub-block is unselected and a second sub-block is selected.

FIG. 25 is a table illustrating a bias condition on an equivalent circuit of FIG. 23 when a first sub-block is selected and a second sub-block is unselected.

DETAILED DESCRIPTION

Figure 1:
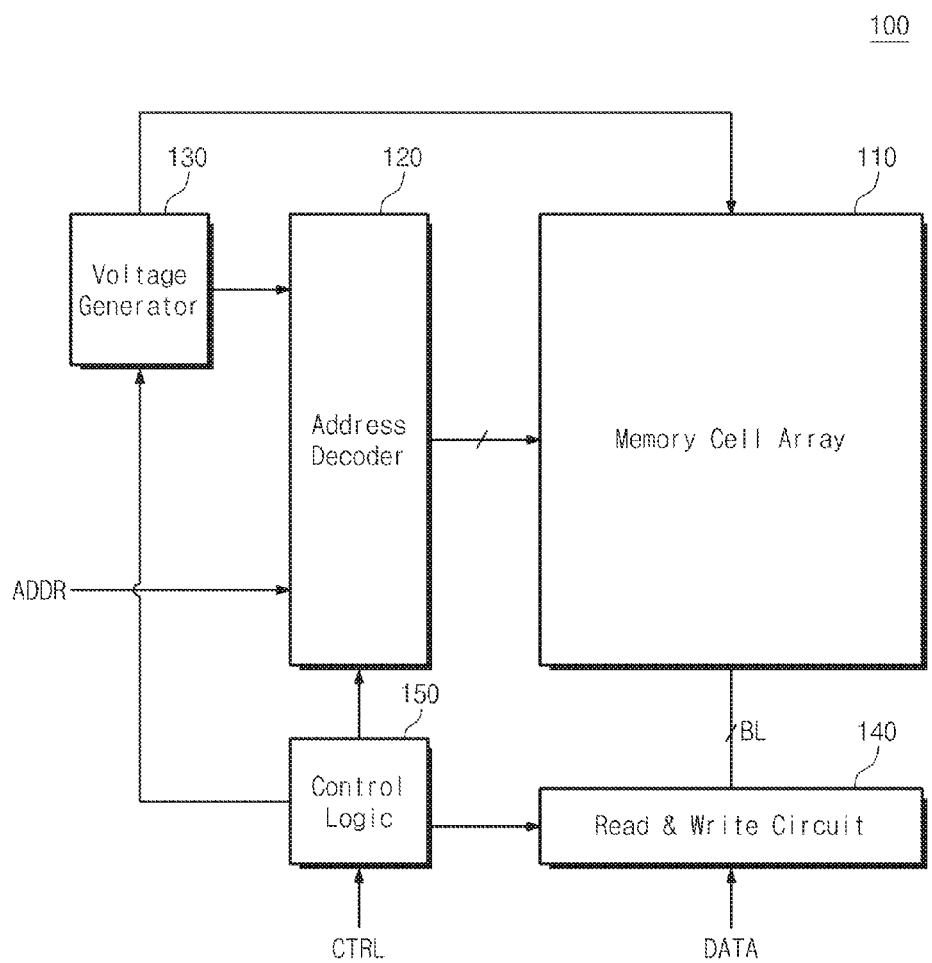
FIG. 1 is a block diagram schematically illustrating a nonvolatile memory according to an embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory according to an embodiment of the inventive concept. Referring to FIG. 1, a nonvolatile memory 100 of this example includes a memory cell array 110, an address decoder 120, a voltage generator 130, a read and write circuit 140, and control logic 150.

The memory cell array 110 may be connected to the address decoder 120. The memory cell array 110 may be connected to the read and write circuit 140 via bit lines BL. The memory cell array 110 may include a plurality of memory cells. The memory cells may be stacked on a substrate. Each of the memory cells may store one or more bits of data.

The address decoder 120 may be connected to the memory cell array 110 via a plurality of lines (e.g., string selection lines, word lines, and ground selection lines). The address decoder 120 may be connected to the voltage generator 130. The address decoder 120 may operate responsive to the control of the control logic 150.

The address decoder 120 may receive an address ADDR from an external device.

The address decoder 120 may decode a row address of the input address ADDR. The address decoder 120 may select a word line corresponding to the decoded row address. The address decoder 120 may select a word line corresponding to the input address ADDR by applying voltages, provided from the voltage generator 130, to the plurality of lines according to the decoded row address.

At an erase operation, the address decoder 120 may apply voltages from the voltage generator 130 to some of the plurality of lines and may float the remaining of the plurality of lines. Points of time in which the remaining lines are floated may be controlled by the control logic 150, respectively. For example, a selection word line voltage may be applied to selected word lines, and unselected word lines may be floated after an erase voltage is supplied to a substrate of the memory cell array 110 and a specific delay time elapses.

The address decoder 120 may decode a column address of the input address ADDR. The address decoder 120 may provide the decoded column address to the read and write circuit 140.

In an embodiment, the address decoder 120 may include a row decoder decoding a row address, a column decoder decoding a column address, and an address buffer storing an address ADDR.

The voltage generator 130 may be connected to the control logic 150 and the address decoder 120. The voltage generator 130 may operate responsive to the control of the control logic 150. The voltage generator 130 may be configured to generate a high voltage. For example, voltages generated by the voltage generator 130 may be transferred to the plurality of lines of the memory cell array 110 via the address decoder 120. A voltage generated by the voltage generator 130 may be supplied to the substrate of the memory cell array 110.

The read and write circuit 140 may be connected to the memory cell array 110 via the bit lines BL. The read and write circuit 140 may operate responsive to the control of the control logic 150. The read and write circuit 140 may receive the decoded column address from the address decoder 120. The read and write circuit 140 may select the bit lines BL using the decoded column address.

In an embodiment, at a program operation, the read and write circuit 140 may program data provided from external the memory cell array 110. At a read operation, the read and write circuit 140 may read data from the memory cell array 110 for external transfer. The read and write circuit 140 may read data from a first storage region of the memory cell array 110 to write it in a second storage region of the memory cell array 110. For example, the read and write circuit 140 may perform a copy-back operation.

In an embodiment, the read and write circuit 140 may include constituent elements such as a page buffer (or, a page register), a column selector, and the like. In another embodiment, the read and write circuit 140 may include constituent elements such as a sense amplifier, a write driver, a column selector, and the like.

In an embodiment, although not shown in FIG. 1, the nonvolatile memory 100 may further comprise a constituent element such as a buffer circuit. In this case, the buffer circuit may receive externally supplied program data at a program operation, and may externally transfer read data at a read operation. The read and write circuit 140 may receive data from the buffer circuit at a program operation, and may transfer data read from the memory cell array 110 to the buffer circuit.

The control logic 150 may be connected to the address decoder 120, the voltage generator 130, and the read and write circuit 140. The control logic 150 may be configured to control an overall operation of the nonvolatile memory 100. The control logic 150 may operate responsive to a control signal CTRL from the outside.

At an erase operation, the control logic 150 may control the voltage generator 130 such that an erase voltage generated from the voltage generator 130 is transferred to the substrate of the memory cell array 110. With the inventive concept, the control logic 150 may adjust a point of time when unselected word lines are floated at an erase operation. For example, the control logic 150 may control the address decoder 120 such that unselected word lines are floated after a specific delay time elapses from a point of time when an erase voltage is supplied to the substrate of the memory cell array 110.

Figure 2:
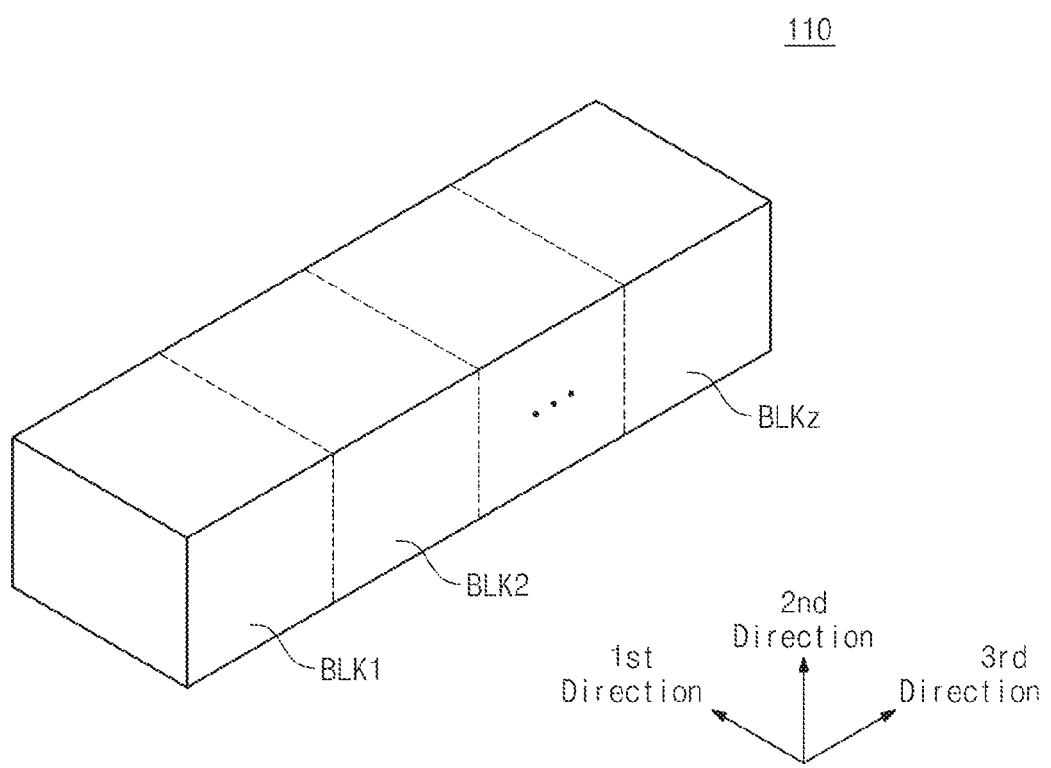
FIG. 2 is a diagram schematically illustrating a memory cell array in FIG. 1 according to an embodiment of the inventive concept.

FIG. 2 is a diagram schematically illustrating a memory cell array in FIG. 1 according to an embodiment of the inventive concept. Referring to FIG. 2, a memory cell array 110 may include a plurality of memory blocks BLK1 through BLKz, each of which is formed to have a three-dimensional structure (or, a vertical structure). For example, each of the memory blocks BLK1 through BLKz may include structures extending along first to third directions. Although not shown in FIG. 2, each of the memory blocks BLK1 through BLKz may include a plurality of cell strings extending along the second direction. For example, a plurality of NAND strings NS may be provided along the first and third directions.

Each memory block may be connected to a plurality of bit lines BL, a plurality of string selection lines, a plurality of ground selection lines, and a common source line. Each NAND string NS may be connected to a bit line, a string selection line, a ground selection line, word lines, and a common source line. Each memory block will be more fully described later with reference to FIG. 4.

The plurality of memory blocks BLK1 through BLKz may be selected by an address decoder 120 in FIG. 1. For example, the address decoder 120 may be configured to select a memory block, corresponding to a decoded row address, from among the plurality of memory blocks BLK1 to BLKz.

Figure 3:
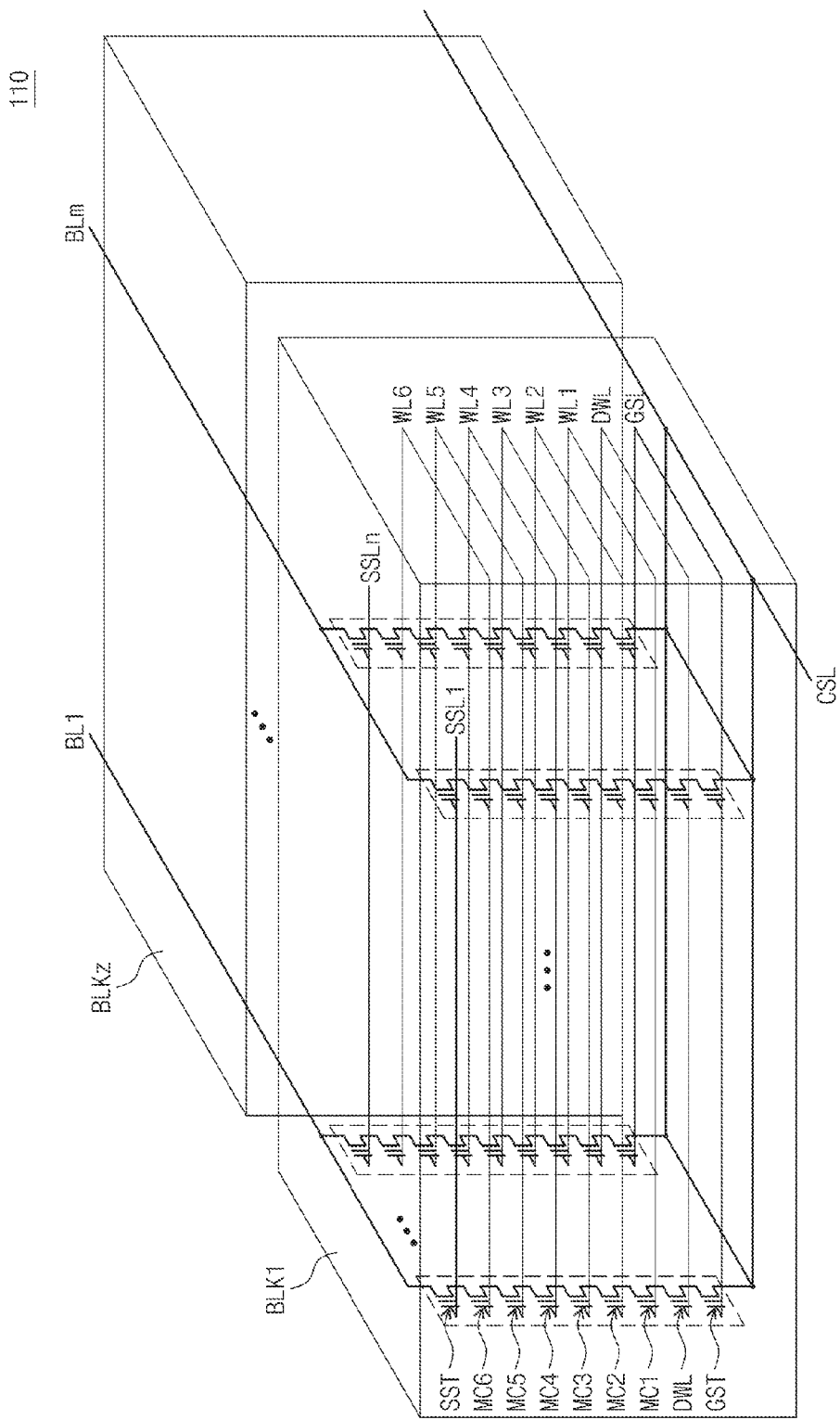
FIG. 3 is a detailed block diagram illustrating memory blocks of FIG. 2.

FIG. 3 is a detailed block diagram illustrating memory blocks BLK1 through BLKz of FIG. 2. In FIG. 3, for ease of illustration, a first memory block BLK1 is illustrated in detail. However, like the first memory block BLK1, the remaining memory blocks BLK2 through BLKz may be configured the same as illustrated in FIG. 3.

Referring to FIG. 3, the memory block BLK1 may include a plurality of NAND strings. One NAND string may include a ground selection transistor GST, a dummy memory cell DMC, first through sixth memory cells MC1 through MC6, and a string selection transistor SST.

The memory block BLK1 may be connected to bit lines BL1 through BLm. The memory block BLK1 may be connected to string selection lines SSL1 through SSLn, first through sixth word lines WL1 through WL6, a dummy word line DWL, a ground selection line GSL, and a common source line CSL.

A gate (or, a control gate) of a string selection transistor SST may be connected to a string selection line SSL1 and between a bit line and the sixth memory cell MC6.

The first through sixth memory cells MC1 through MC6 may be connected in series, and may be connected to the string selection transistor SST and a dummy memory cell DMC. Gates (or, control gates) of the first through sixth memory cells MC1 through MC6 may be connected to first through sixth word lines WL1 through WL6, respectively.

The dummy memory cell DMC may be connected to the first memory cell MC1 and a ground selection transistor GST. A gate (or, a control gate) of the dummy memory cell DMC may be connected to the dummy word line DWL. The ground selection transistor GST may be connected between the dummy memory cell DMC and the common source line CSL. A gate (or, a control gate) of the ground selection transistor GST may be connected to the ground selection line GSL.

The memory cell array 110 illustrated in FIG. 3 is an example only, and the inventive concept is not limited thereto. As one variation, for example, one NAND string can be configured to include 7 or more memory cells and to include two or more dummy memory cells.

Figure 4:
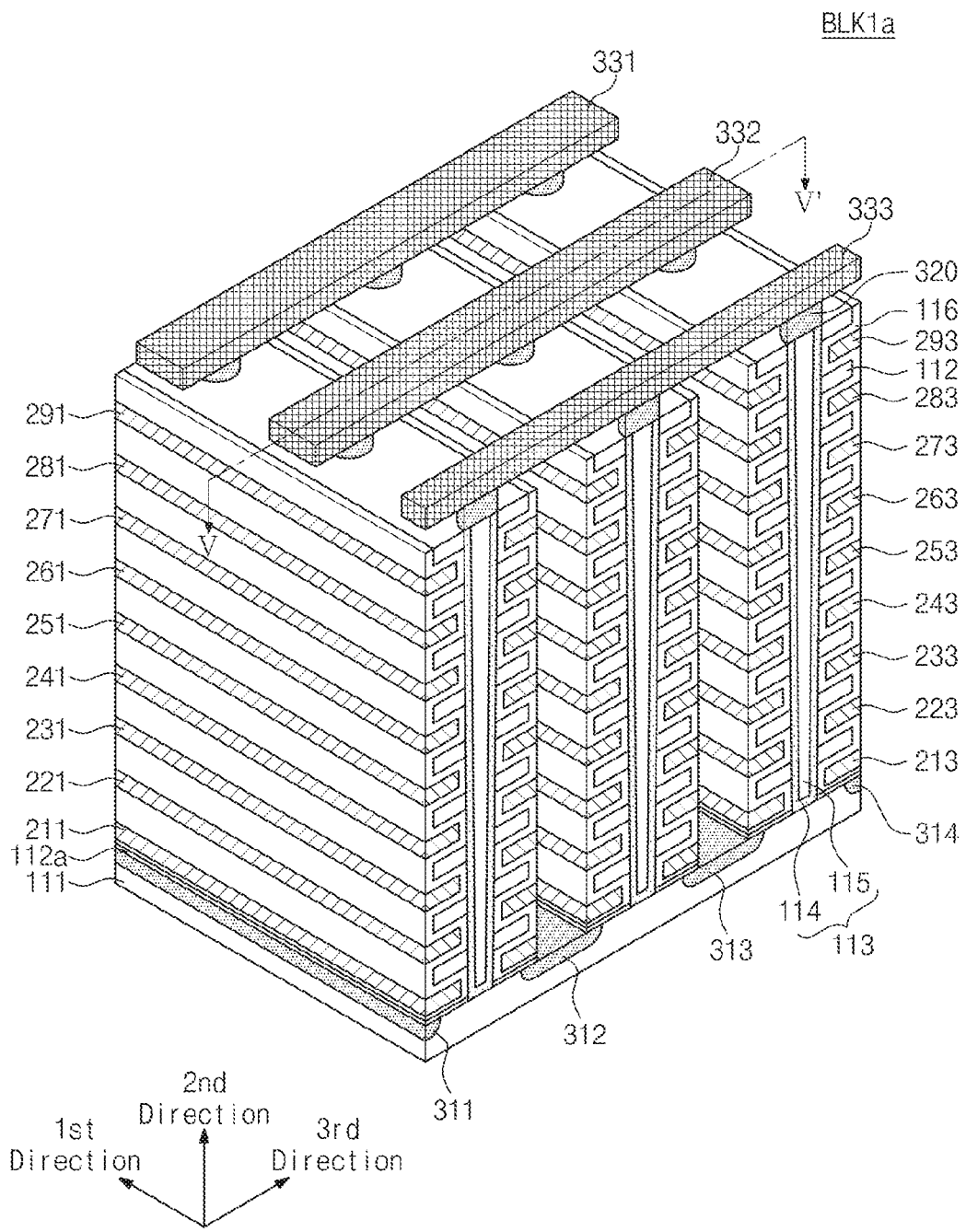
FIG. 4 is a perspective view of a part of a memory block according to an embodiment of the inventive concept.
Figure 5:
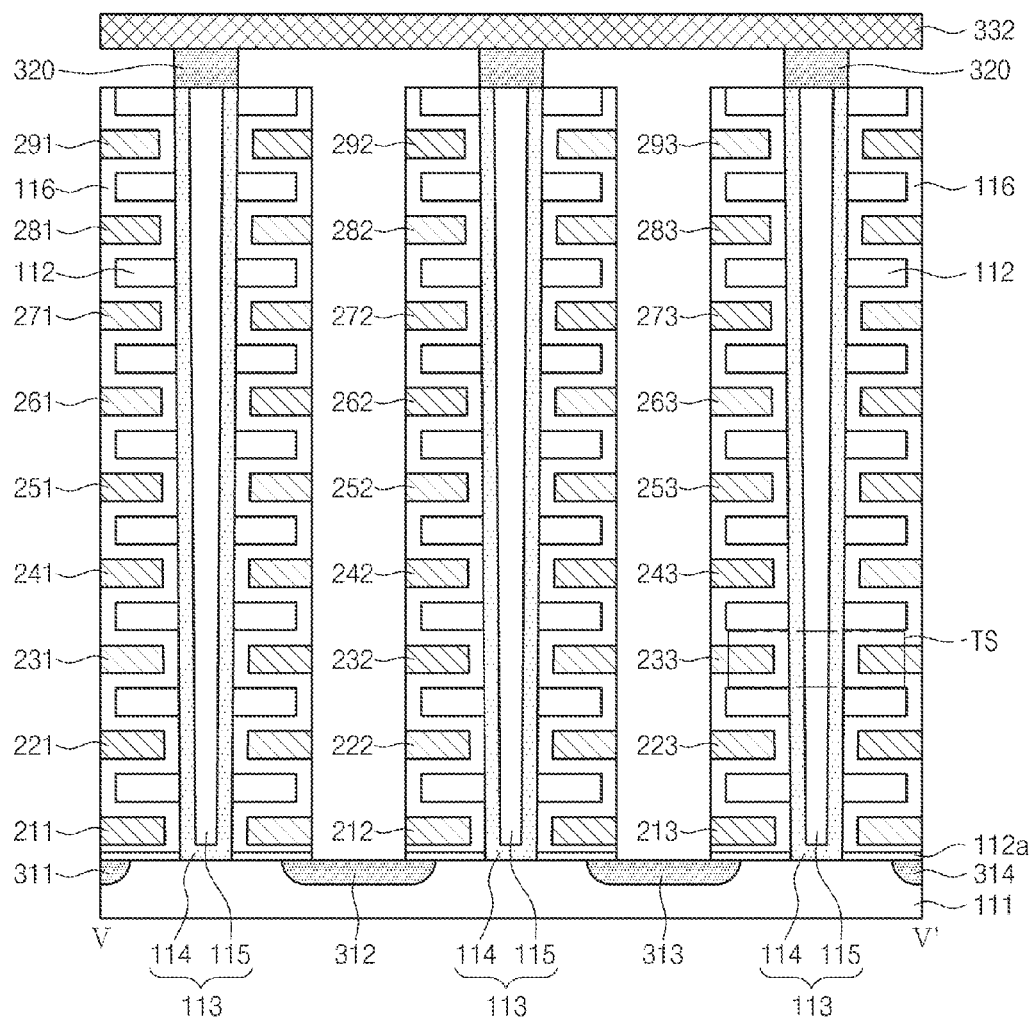
FIG. 5 is a cross-sectional view taken along a line V-V' of FIG. 5.

FIG. 4 is a perspective view of a part of a memory block BLK1 according to an embodiment of the inventive concept, and FIG. 5 is a cross-sectional view taken along a line V-V' of FIG. 5. Referring to FIGS. 4 and 5, a part BLK1a of a memory block BLK1 may include structures that extend along first to third directions.

First, a substrate 111 may be provided. Exemplarily, the substrate 111 may be a well of a first type (e.g., a first conductive type). For example, the substrate 111 may be a p-well in which a Group III element such as boron is injected. For example, the substrate 111 may be a pocket p-well which is provided within an n-well. Below, it is assumed that the substrate 111 is a p-well (or, a pocket p-well). However, the substrate 111 is not limited thereto.

A plurality of doping regions 311 through 314 extending along the first direction may be provided at the substrate 111. For example, a plurality of doping regions 311 through 314 may have a second type different from the substrate 111. For example, the doping regions 311 through 314 may be an n-type. Hereinafter, it is assumed that the first through fourth doping regions 311 through 314 are an n-type. However, the first through fourth doping regions 311 through 314 are not limited thereto.

On the substrate 111 between the first and second doping regions 311 and 312, a plurality of insulating materials 112 and 112*a* extending along the first direction may be sequentially provided along the second direction. For example, the insulating materials 112 and 112*a* may include an insulating material such as silicon oxide. For example, a thickness of an insulating material 112*a* contacting with the substrate 111 may be thinner than those of the remaining insulating materials 112. For example, the plurality of insulating materials 112 may be formed to be separated by a predetermined distance along the second direction.

On the substrate 111 between the first and second doping regions 311 and 312, a plurality of pillars 113 may be provided which are sequentially disposed along the first direction and pass through the insulating materials 112 along the second direction. Exemplarily, the pillars 113 may contact the substrate 111 through the insulating materials 112, respectively.

Exemplarily, each of the pillars 113 may be formed of a plurality of materials. For example, a surface layer 114 of each pillar 113 may include a silicon material having the first type. For example, the surface layer 114 of each pillar 113 may include a silicon material having the same type as the substrate 111. Hereinafter, it is assumed that the surface layer 114 of each pillar 113 includes p-type silicon. However, the surface layer 114 of each pillar 113 is not limited thereto.

An inner layer 115 of each pillar 113 may be formed of an insulating material. For example, the inner layer 115 of each pillar 113 may include an insulating material such as silicon oxide. For example, the inner layer 115 of each pillar 113 can include an air gap.

Between the first and second doping regions 311 and 312, an insulating film 116 may be provided along exposed surfaces of the substrate 11, the insulating materials 112, and the pillars 113. For example, the thickness of the insulating film 116 may be less than half a distance between the insulating materials 112. That is, a region where a material other than the insulating materials 112 and the insulation layer 116 is disposed may be provided between an insulating film 116 provided on a lower surface of a first insulating material among the insulating materials 112 and an insulating film 116 provided on an upper surface of a second insulating material and at the lower portion of the first insulating material.

Between the first and second doping regions 311 and 312, first conductive materials 211 through 291 may be provided on an exposed surface of the insulating film 116. For example, the first conductive material 211 extending along the first direction may be provided between the substrate 111 and the insulating material 112 adjacent to the substrate 111. A plurality of first conductive materials 221 through 281 extending along the first direction may be provided among the insulating materials 112. For example, the first conductive materials 211 through 291 may be a metal material. For example, the first conductive materials 211 through 291 may be a conductive material.

The same structure as the first and second doping regions 311 and 312 may be provided between the second and third doping regions 312 and 313. Between the second and third doping regions 312 and 313, exemplarily, there may be provided the insulating materials 112 extending along the first direction, the pillars 113 sequentially disposed in the first direction and passing through the insulating materials 112 along the second direction, the insulating film 116 exposed surfaces of the pillars 113 and the insulating materials 112, and the first conductive materials 212 through 292 extending along the first direction.

The same structure as a structure on the first and second doping regions 311 and 312 may be provided between the third and fourth doping regions 313 and 314. Between the third and fourth doping regions 313 and 314, exemplarily, there may be provided the insulating materials 112 extending along the first direction, the pillars 113 sequentially disposed in the first direction and passing through the insulating materials 112 in the third direction, the insulation layer 116 the exposed surfaces of the insulating materials 112 and the pillars 113, and the first conductive materials 213 through 293 extending along the first direction.

Drains 320 may be provided on the pillars 113, respectively. Exemplarily, the drains 320 may include a silicon material that is doped of a second type. For example, the drains 320 may be an n-type silicon material. Hereinafter, it is assumed that the drains 320 include an n-type silicon material. However, the drains 320 are not limited thereto.

Exemplarily, the width of each of the drains 320 may be wider than that of a corresponding pillar 113. For example, each drain 320 may be provided in a pad shape on the upper surface of a corresponding pillar 113. Exemplarily, each drain 320 may be extended up to a part of the surface layer 114 of a corresponding pillar 113.

Second conductive materials 331 through 333 extending along the third direction may be provided on the drains 320. The conductive materials 331 through 333 may be spaced apart along the first direction. The conductive materials 331 to 333 may be connected to the drains 320 of corresponding regions, respectively. Exemplarily, the drains 320 and the second conductive material 333 extending along the third direction may be connected through contact plugs. Exemplarily, the second conductive materials 331 through 333 may be a metal material. Exemplarily, the second conductive materials 331 through 333 may be a conductive material such as polysilicon.

Below, heights of the first conductive materials 211 through 291, 212 through 292, and 213 through 293 may be defined. The first conductive materials 211 through 291, 212 through 292, and 213 through 293 may be defined to have first through ninth heights sequentially from a substrate 111. The first conductive materials 211 through 213 adjacent to the substrate 111 may have a first height. The first conductive materials 291 through 293 adjacent to first conductive materials 331 through 333 may have a ninth height. A height of each of the first conductive materials 211 through 291, 212 through 292, and 213 through 293 may increase in proportion to a distance from the substrate 111.

In FIGS. 4 and 5, each pillar 113 may form a string together with the first conductive materials 211 through 291, 212 through 292, and 213 through 293. For example, each pillar 113 may form a NAND string NS together with an adjacent region of an insulating film 116 and an adjacent region among the first conductive materials 211 through 291, 212 through 292, and 213 through 293. The NAND string NS may include a plurality of transistor structures TS. The transistor structure TS will be more fully described with reference to FIG. 6.

Figure 6:
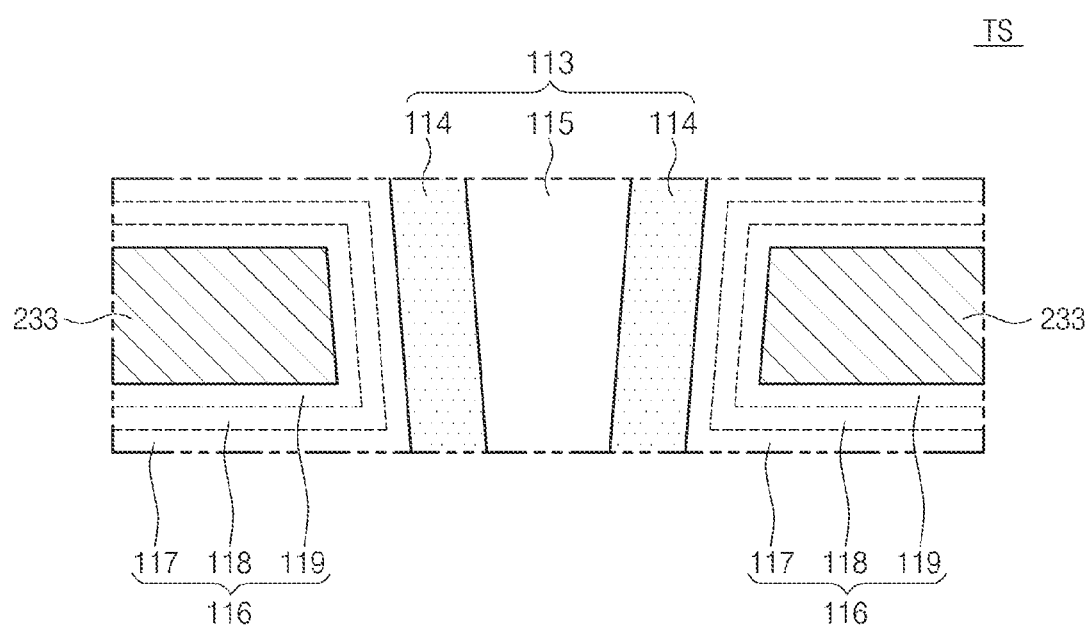
FIG. 6 is a cross-sectional view of a transistor structure in FIG. 5.

FIG. 6 is a cross-sectional view of a transistor structure TS in FIG. 5. Referring to FIGS. 4 through 6, an insulating film 116 may include first to third sub-insulating films 117 through 119.

A p-type silicon surface layer 114 of a pillar 113 may act as a body. The first sub-insulating film 117 may act as a tunneling insulating film. For example, the first sub-insulating film 117 adjacent to the pillar 113 may include a thermal oxide layer.

The second sub-insulating film 118 may act as a charge storage film. For example, the second sub-insulating film 118 may act as a charge trap layer. For example, the second sub-insulating film 118 may include a nitride layer or a metal oxide layer (e.g., an aluminum oxide layer, a hafnium oxide layer, or the like).

Exemplarily, the third sub-insulating film 119 adjacent to a first conductive material 233 may act as a blocking insulating film. The third sub-insulating film 119 may be a high-k dielectric layer (e.g., an aluminum oxide layer or a hafnium oxide layer) having a higher dielectric constant than the first and second sub-insulating films 117 and 118 (e.g., silicon dioxide).

The first conductive material 233 may serve as a gate (or a control gate). That is, the first conductive material 233 serving as a gate (or a control gate), the third sub-insulating film 119 serving as the blocking insulating film, the second sub-insulating film 118 serving as the charge storage layer, the first sub-insulating film 117 serving as the tunneling insulation layer, and the p-type surface layer 114 serving as a body may form a transistor (or, a memory cell transistor structure). Exemplarily, the first through third sub-insulating films 117 through 119 may form oxide-nitride-oxide (ONO). Below, it is assumed that the p-type surface layer 114 of the pillar 113 serves as a second-direction body.

In a part BLK1a of a memory block BLK1, one pillar 113 may correspond to one NAND string NS. The part BLK1a of a memory block BLK1 may include a plurality of pillars 113. That is, the memory block BLK1 may include a plurality of NAND strings NS.

Each NAND string NS may include a plurality of transistor structures TS that are stacked along a second direction. At least one of the transistor structures TS of each NAND string NS may serve as a string selection transistor SST. At least one of the transistor structures TS of each NAND string NS may serve as a ground selection transistor GST.

Gates (or control gates) may correspond to the first conductive materials 211 through 291, 212 through 292, and 213 through 293 extending along the first direction. That is, the gates (or the control gates) may be extended in the first direction to form string selection lines SSL (refer to FIG. 7), word lines WL (refer to FIG. 7), at least one dummy word line DWL (refer to FIG. 7), and at least one ground selection line GSL (refer to FIG. 7).

The second conductive materials 331 through 333 extending in the third direction may be connected to one ends of the NAND strings NS, respectively. The second conductive materials 331 through 333 may act as bit lines BL. In the memory block BLK1, one bit line may be connected with a plurality of NAND strings. Further, one bit line may be connected with NAND strings of the memory block BLK1 as well as NAND strings of memory blocks BLK2 through BLKz (refer to FIG. 3).

Second-type doping regions 311 through 314 extending in the first direction may be provided to other ends of the NAND strings NS, respectively. The second-type doping regions 311 through 314 may serve as a common source line CSL.

To sum up the above-described, the memory block BLK1 may include a plurality of NAND strings that are extended in a direction (i.e., the second direction) vertical to the substrate 111, and a plurality of NAND strings NS may be connected to one bit line BL.

FIGS. 4 to 6 were described under the assumption first conductive lines 211 through 291, 212 through 292, and 213 through 293 are formed at nine layers. However, the inventive concept is not limited thereto. For example, first conductive materials can be formed on at least 8 or 16 layers for memory cells and at least 2 layers for selection transistors.

An area (hereinafter, referred to as a cross-section area) of a pillar 113 taken along first and third directions may be varied due to process characteristics or errors. As illustrated in FIGS. 4 through 6, the closer to the substrate 111, the narrower the cross-sectional area. The pillar 113 may be formed by filling a hole formed by etching with materials such as a silicon material and an insulating material. The cross-sectional area of a hole formed by etching may decrease in proportion to an increase of an etched depth.

Figure 7:
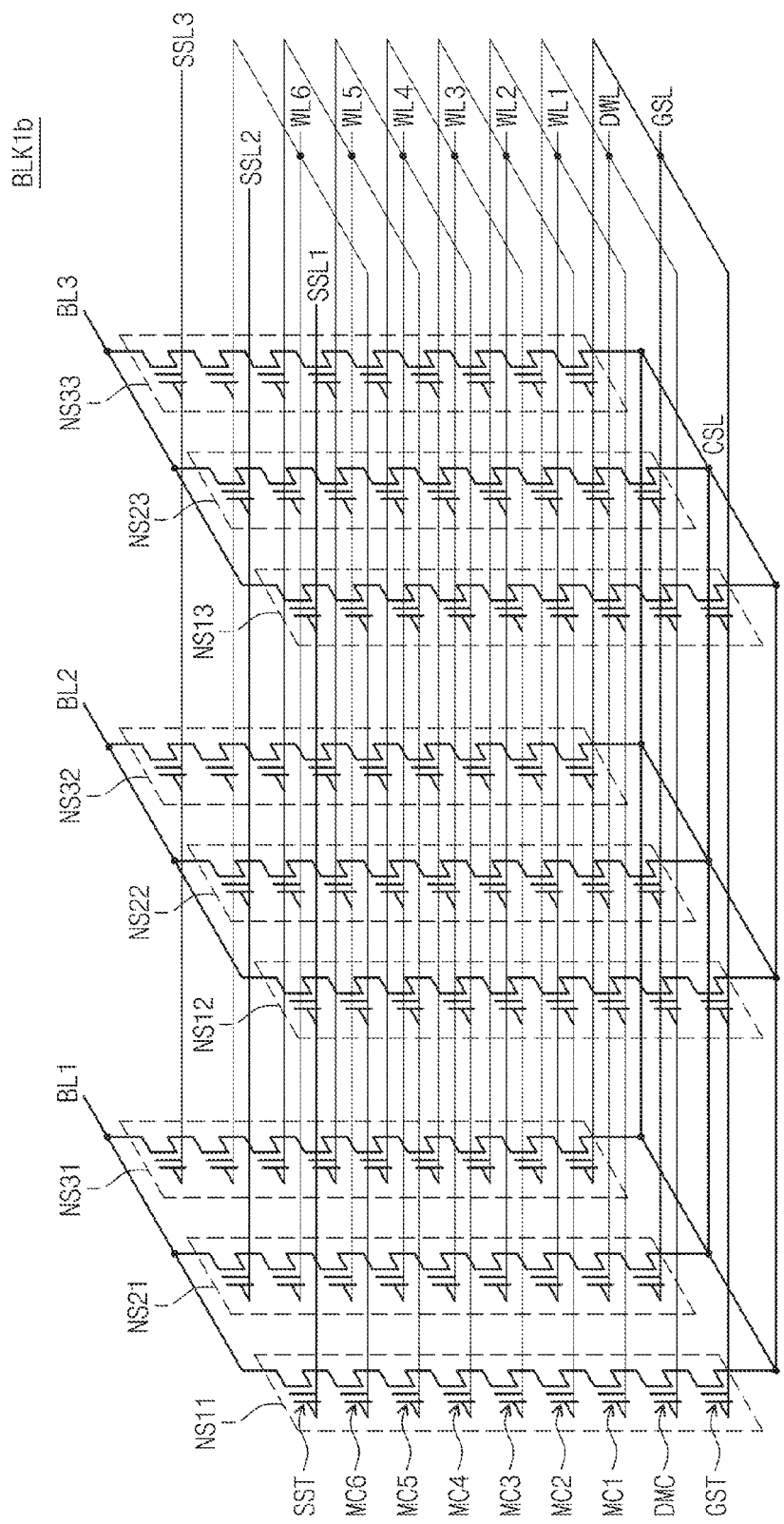
FIG. 7 is an equivalent circuit diagram of a part of a memory block.

FIG. 7 is an equivalent circuit diagram of a part BLK1a of a memory block BLK1. Referring to FIGS. 4 to 7, NAND strings NS11, NS21, and NS31 may be provided between a first bit line BL1 and a common source line CSL. NAND strings NS12, NS22, and NS32 may be provided between a second bit line BL2 and the common source line CSL. NAND strings NS13, NS23, and NS33 may be provided between a third bit line BL3 and the common source line CSL. The first through third bit lines BL1 through BL3 may correspond to conductive material 331 through 333 extending in the third direction, respectively.

A string selection transistor SST of each NAND string NS may be connected to a corresponding bit line BL. A ground selection transistor GST of each NAND string NS may be connected to the common source line CSL. In each NAND string NS, memory cells MC may be provided between the string selection transistor SST and the ground selection transistor GST.

Below, NAND strings NS may be defined by row and by column. The NAND strings NS connected to one bit line in common may form one column. For example, the NAND strings NS11 through NS31 connected to the first bit line BL1 may correspond to a first column. The NAND strings NS12 through NS32 connected to the second bit line BL2 may correspond to a second column. The NAND strings NS13 through NS33 connected to the third bit line BL3 may correspond to a third column.

The NAND strings NS connected to one string selection line SSL may form one row. For example, the NAND strings NS11 through NS13 connected to a first string selection line SSL1 may form a first row. The NAND strings NS21 through NS23 connected to a second string selection line SSL2 may form a second row. The NAND strings NS31 through NS33 connected to a third string selection line SSL3 may form a third row.

In each NAND string NS, a nominal height (i.e., relative vertical location) may be defined. Exemplarily, in each NAND string NS, the ground selection transistor GST may be defined to have a nominal height of 1. A dummy memory cell DMC adjacent to the ground selection transistor GST may be defined to have a nominal height of 2. A memory cell MC1 adjacent to the dummy memory cell DMC may be defined to have a nominal height of 3. The string selection transistor SST may be defined to have a nominal height of 9. A memory cell MC6 adjacent to the string selection transistor SST may be defined to have a nominal height of 8.

As a memory cell is far from the ground selection transistor GST, a nominal height of a memory cell may increase. That is, first through third memory cells MC1 through MC3 may be defined to have third through fifth nominal heights, respectively, and fourth through sixth memory cells MC4 through MC6 may be defined to have sixth through eight nominal heights, respectively.

The NAND strings NS11 through NS13, NS21 through NS23, and NS31 through NS33 may share a ground selection line GSL. The first conductive materials 211 through 213 having the first nominal height may be interconnected to form the ground selection line GSL.

In each NAND string in the same row, memory cells having the same nominal height may share a word line WL. NAND strings having the same nominal height and corresponding to different rows may share a word line. That is, memory cells having the same nominal height may share a word line WL.

The first conductive materials 221 through 223 having the second nominal height may be interconnected to form a dummy word line DWL. The first conductive materials 231 through 233 having the third nominal height may be interconnected to form a first word line WL1. The first conductive materials 241 through 243 having the fourth nominal height may be interconnected to form a second word line WL2. The first conductive materials 251 through 253 having the fifth nominal height may be interconnected to form a third word line WL3. The first conductive materials 261 through 263 having the sixth nominal height may be interconnected to form a fourth word line WL4. The first conductive materials 271 through 273 having the seventh nominal height may be interconnected to form a fifth word line WL5. The first conductive materials 281 through 283 having the eighth nominal height may be interconnected to form a sixth word line WL6.

NAND strings in the same row may share the string selection line SSL. NAND strings in different rows may be connected to different string selection lines SSL1, SSL2, and SSL3, respectively. The string selection lines SSL1, SSL2, and SSL3 may correspond to first conductive materials 291 through 293 having the ninth height, respectively.

The common source line CSL may be connected in common to NAND strings NS. For example, first through fourth doping regions 311 through 314 may be interconnected to form the common source line CSL. Further, the common source line CSL may be connected in common to NAND strings within a memory cell array 110 (refer to FIG. 3).

As illustrated in FIG. 7, word lines placed at the same nominal height may be connected in common Thus, when a word line placed at a specific nominal height is selected, all NAND strings connected with the selected word line may be selected.

NAND strings in different rows may be connected to different string selection lines. Thus, NAND strings in an unselected row from among NAND strings connected with the same word line may be separated from a corresponding bit line and NAND strings in a selected row may be connected to a corresponding bit line, by selecting and unselecting string selection lines SSL1 through SSL3.

That is, a row of NAND strings may be selected by selecting and unselecting the string selection lines SSL1 through SSL3. This operation may be executed by an address decoder 120 (refer to FIG. 1). A column of NAND strings in a selected row may be selected by selecting bit lines BL1 through BL3.

In an embodiment, at program and read operations, one of the string selection lines SSL1 through SSL3 may be selected. That is, the program and read operations may be executed by a row unit of NAND strings NS11 through NS13, NS21 through NS23, and NS31 through NS33.

Figure 8:
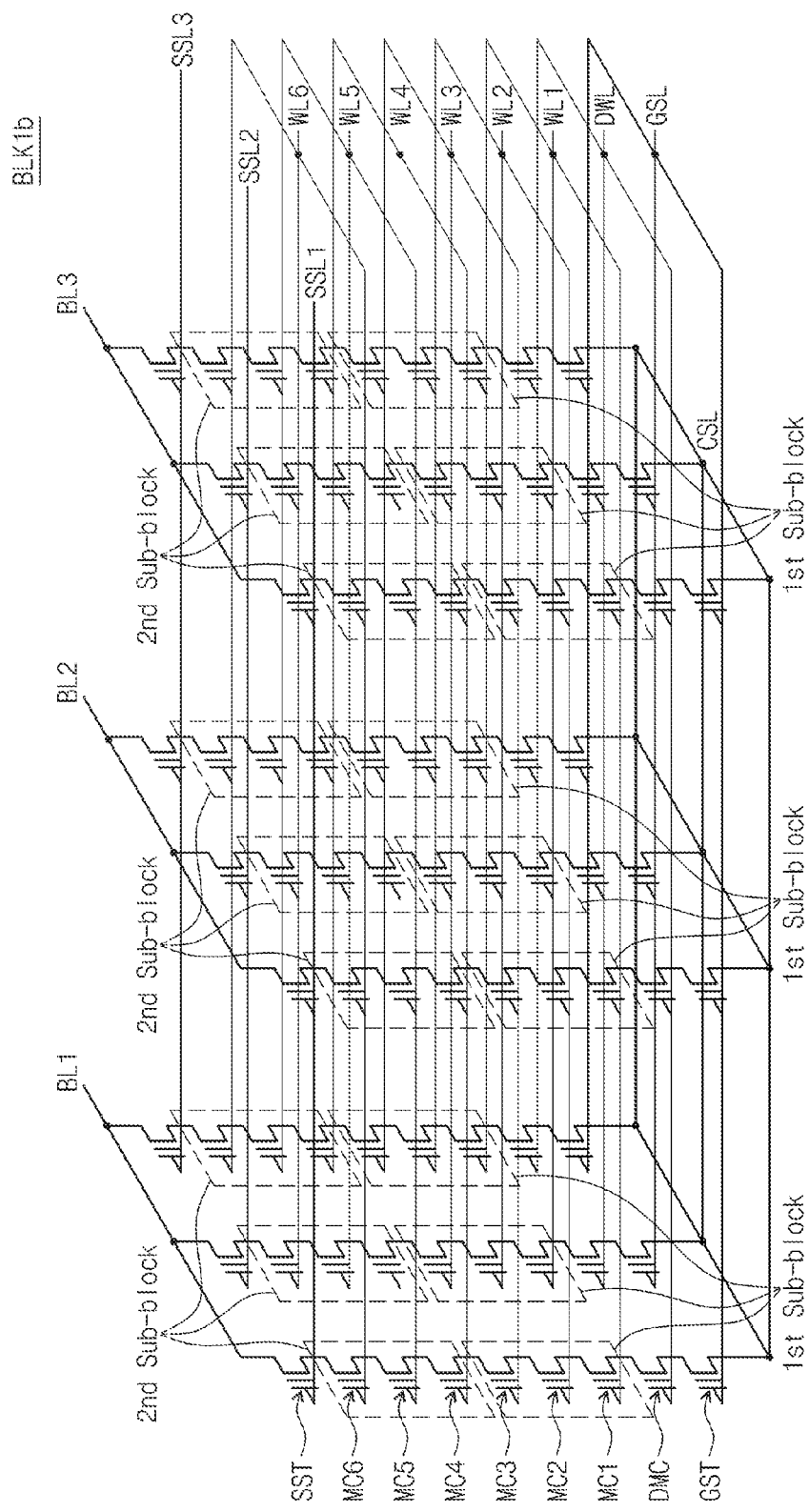
FIG. 8 is a circuit diagram illustrating an embodiment in which memory cells of an equivalent circuit in FIG. 7 are included in two sub-blocks.

FIG. 8 is a circuit diagram illustrating an embodiment in which memory cells of an equivalent circuit in FIG. 7 are included in two sub-blocks. Referring to FIG. 8, a first sub-block may be formed of first through third memory cells MC1 through MC3. That is, memory cells placed at third through fifth nominal heights may be included in the first sub-block. A second sub-block may include fourth through sixth memory cells MC4 through MC6. Memory cells placed at sixth through eighth nominal heights may constitute the second sub-block.

An erase operation may be executed by a sub-block unit. Sub-blocks may be erased independently. For example, when the first sub-block is erased, the second sub-block may be erase-inhibited. When the second sub-block is erased, the first sub-block may be erase-inhibited. That is, in each NAND string, while some (e.g., MC1 through MC3) of memory cells MC1 through MC6 are erased, the remaining (e.g., MC4 through MC6) of the memory cells MC1 through MC6 may be erase-inhibited.

Figure 9:
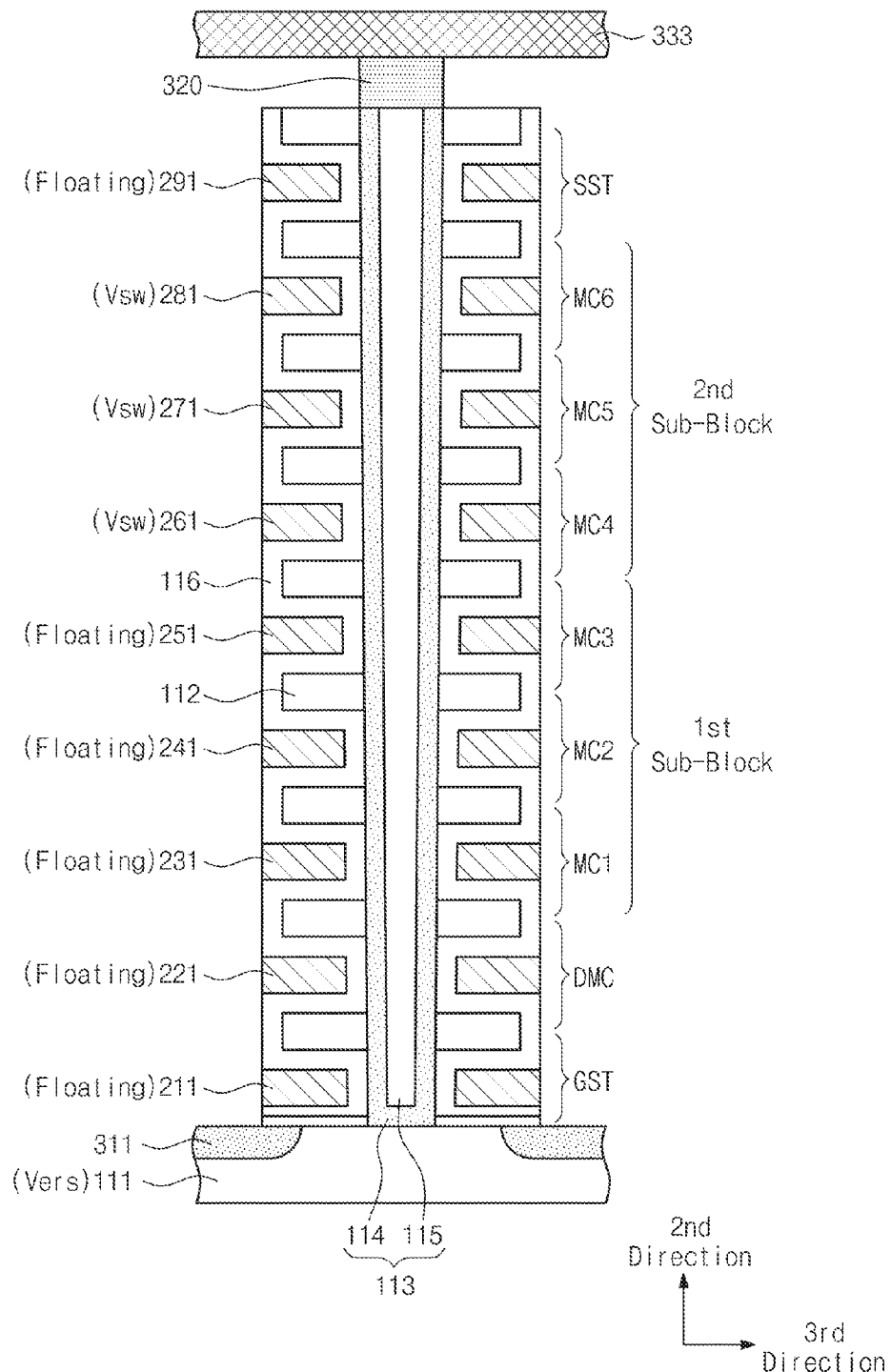
FIG. 9 is a diagram illustrating one NAND string supplied with a plurality of voltages at an erase operation.

FIG. 9 is a diagram illustrating one NAND string supplied with a plurality of voltages at an erase operation. It is assumed that a second sub-block is erased and a first sub-block is erase-inhibited.

Referring to FIGS. 8 and 9, at an erase operation, an erase voltage Vers may be supplied to a substrate 111. At this time, the erase voltage Vers may be a high voltage. A conduction type of the substrate 111 may be identical to that of a surface layer 114 which acts as a second-direction body.

A first conductive material 211 having a first nominal height may act as a ground selection line GSL, that is, a gate (or, a control gate) of a ground selection transistor GST. The first conductive material 211 may be floated. The conductive material 211 may be affected by the coupling from the substrate 111 and the surface layer 114. Thus, a voltage of the first conductive material 211 may be increased when a voltage of the surface layer 114 rises to the erase voltage Vers. A difference between the erase voltage Vers and the increased voltage of the first conductive material 211 may be insufficient to cause the Fowler-Nordheim tunneling. Accordingly, the ground selection transistor GST may be erase-inhibited.

A first conductive material 221 having a second nominal height may act as a dummy word line DWL and as a gate (or, a control gate) of a dummy memory cell DMC. The first conductive material 221 may be floated. Thus, the first conductive material 221 may be affected by coupling from the surface layer 114. Thus, a voltage of the first conductive material 221 may be increased when a voltage of the surface layer 114 rises to the erase voltage Vers. A difference between the erase voltage Vers and the increased voltage of the first conductive material 221 may be insufficient to cause the Fowler-Nordheim tunneling. Accordingly, the dummy memory cell DMC may be erase-inhibited.

First conductive materials 231 through 251 having third through fifth nominal heights may act as first through third word lines WL1 through WL3 and as gates (or, control gates) of first through third memory cells MC1 through MC3, respectively. The first conductive materials 231 through 251 acting as unselected word lines may be floated. The first conductive materials 231 through 251 may be affected by coupling from the surface layer 114. Thus, voltages of the first conductive materials 231 through 251 may be increased when a voltage of the surface layer 114 rises to the erase voltage Vers. A difference between the erase voltage Vers and the increased voltages of the first conductive materials 231 through 251 may be insufficient to cause the Fowler-Nordheim tunneling. Accordingly, the first through third memory cells MC1 through MC3 of a first sub-block unselected may be erase-inhibited.

First conductive materials 261 through 281 having sixth through eighth nominal heights may act as fourth through sixth word lines WL4 through WL6 and as gates (or, control gates) of fourth through sixth memory cells MC4 through MC6, respectively. The first conductive materials 261 through 281 acting as selected word lines may be supplied with a selection word line voltage Vsw. For example, the selection word line voltage Vsw may be a low voltage. A difference between the erase voltage Vers of the surface layer 114 and the selection word line voltage Vsw may be sufficient to cause the Fowler-Nordheim tunneling. Accordingly, the fourth through sixth memory cells MC4 through MC6 of a second sub-block may be erased.

A first conductive material 291 having a ninth nominal height may act as a string selection line SSL and as a gate (or, a control gate) of a string selection transistor SST. The string selection line SSL may be floated. The conductive material 291 may be affected by the coupling from the surface layer 114. Thus, a voltage of the first conductive material 291 may be increased when a voltage of the surface layer 114 rises to the erase voltage Vers. A difference between the erase voltage Vers and the increased voltage of the first conductive material 291 may be insufficient to cause the Fowler-Nordheim tunneling. Accordingly, the string selection transistor SST may be erase-inhibited.

The erase voltage Vers supplied to the substrate 111 may not be transferred stably to the surface layer 114. If the first conductive material 211 acting as the ground selection line GSL is floated, a voltage of the first conductive material 211 may be increased when the erase voltage Vers supplied to the substrate 111 is increased. The increased voltage of the first conductive material 211 may hinder the erase voltage Vers supplied to the substrate 111 from being stably transferred to the surface layer 114.

For example, a transfer of the erase voltage Vers supplied to the substrate 111 may be understood as a transfer of a hole to the surface layer 114 from the substrate 111. An increase in a voltage of the first conductive material 211 may hinder a hole from being transferred to the surface layer 114 from the substrate 111. A voltage of the first conductive material 221 acting as the dummy word line DWL and voltages of the first conductive materials 231 through 251 acting as the first through third word lines WL1 through WL3 may be increased by the coupling effect. The increased voltages of the first conductive materials 231 through 251 may also hinder a hole from being transferred to the surface layer 114 from the substrate 111.

In another example, if a voltage of the first conductive material 221 is increased according to an increase in the erase voltage Vers supplied to the substrate 111, a channel may be formed at a surface layer corresponding to the ground selection transistor GST. In this case, the surface layer corresponding to the ground selection transistor GST may be unintentionally changed into an n-type. This means that the erase voltage Vers of the substrate 111 being a p-type is not transferred stably to the surface layer 114. Likewise, a channel may be formed at a surface layer corresponding to the dummy memory cell DMC and the first through third memory cells MC1 through MC3 due to increased voltages of the first conductive materials 221 through 251. In this case, the erase voltage Vers of the substrate 111 may not be transferred stably to the surface layer 114.

In addition, the erase voltage Vers of the substrate 111 may not be transferred stably to the surface layer 114 due to various causes.

In the event that the erase voltage Vers of the substrate 111 is not transferred stably to the surface layer 114, for example, a voltage of the surface layer 114 may be lower than the erase voltage Vers. A difference between the voltage of the surface layer 114 and the selection word line voltage Vsw may be insufficient to generate the Fowler-Nordheim tunneling. Accordingly, it is difficult to secure the reliability of the erase operation.

FIG. 10 is a table of a bias condition in the event that memory cells of a memory block BLK1 are included within two sub-blocks. Referring to FIGS. 8 through 10, an erase voltage Vers may be supplied to a substrate 111 at an erase operation.

A ground selection line GSL may be floated after a lapse of a specific delay time from a point of time when the erase voltage Vers is supplied. After supplied with a ground selection line voltage Vgsl, the ground selection line GSL may be floated.

With the inventive concept, a dummy word line DWL may be floated after the erase voltage Vers is supplied and a specific delay time elapses. After being supplied with a dummy word line voltage Vdw, the dummy word line DWL may be floated. After being supplied with a non-selection word line voltage Vusw, word lines of an unselected sub-block may be floated.

In an embodiment, the ground selection line voltage Vgsl, the dummy word line voltage Vdw, and the non-selection word line voltage Vusw may be a low voltage. For example, the ground selection line voltage Vgsl, the dummy word line voltage Vdw, and the non-selection word line voltage Vusw may be a ground voltage Vss.

A selection word line voltage Vsw being a low voltage may be supplied to word lines of a selected sub-block. For example, the selection word line voltage Vsw may be a ground voltage Vss. A string selection line SSL may be floated.

With the inventive concept, the ground selection line GSL, the dummy word line, and the word lines of the unselected sub-block may be floated after the erase voltage Vers is supplied and a specific delay time elapses. As low voltages are provided to the ground selection line GSL, the dummy word line, and the word lines of the unselected sub-block before floated, the erase voltage Vers supplied to the substrate 111 may be stably transferred to a surface layer 114. Thus, it is possible to improve the reliability of an erase operation on memory cells of a selected sub-block.

Figure 11:
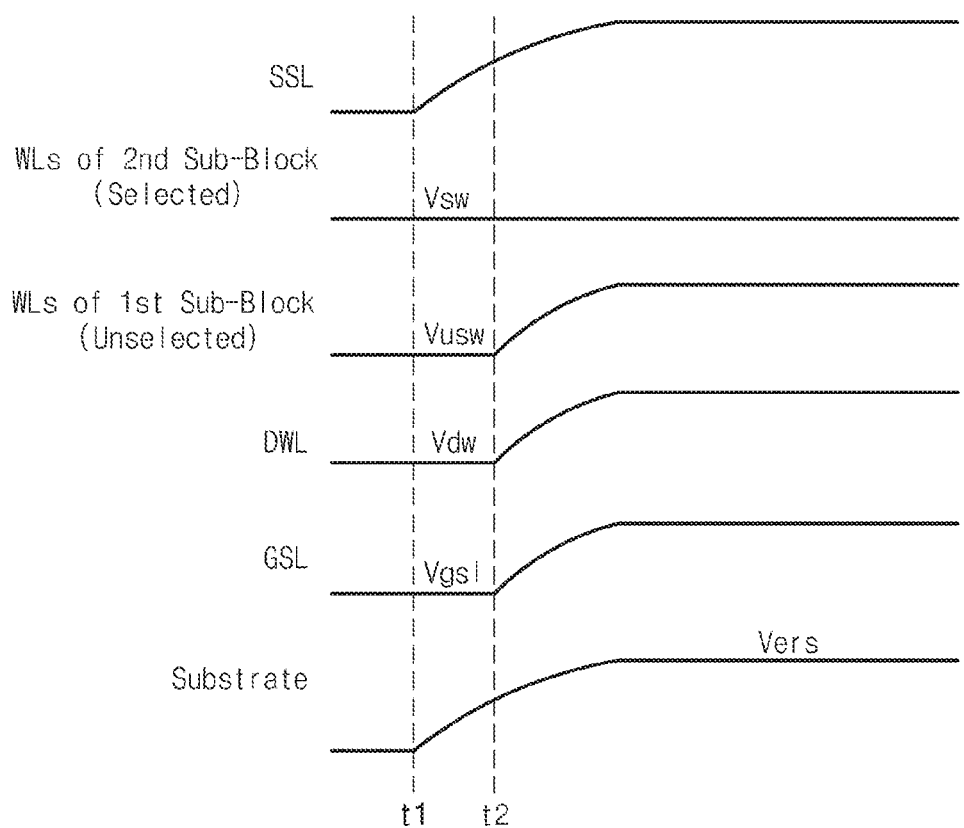
FIG. 11 is a timing diagram illustrating an embodiment of a voltage variation of a memory block according to a bias condition of FIG. 10.

FIG. 11 is a timing diagram illustrating an embodiment of a voltage variation of a memory block BLK1 according to a bias condition of FIG. 10. It is assumed that a second sub-block is a sub-block to be erased. That is, a first sub-block may be an unselected sub-block, and the second sub-block may be a selected sub-block.

Referring to FIGS. 9 through 11, at t1, an erase voltage Vers may start to be supplied to a substrate 111. The erase voltage Vers may be a high voltage.

At the point of time t1 when the erase voltage Vers starts to be applied, a ground selection line voltage Vgsl may be applied to a ground selection line GSL, a dummy word line voltage Vdw to a dummy word line DWL, and a non-selection word line voltage Vusw to word lines WL1 through WL3 of the first sub-block.

The ground selection line voltage Vgsl, the dummy word line voltage Vdw, and the non-selection word line voltage Vusw may be a low voltage. A difference between each of the voltages Vgsl, Vdw, and Vusw and the erase voltage Vers may be maintained between t1 and t2. Thus, the erase voltage Vers increasing may be stably transferred to a surface layer 114 corresponding to memory cells MC4 through MC6 of the second sub-block.

At t1, a selection word line Vsw may be supplied to word lines WL4 through WL6 connected with the second sub-block. The selection word line Vsw may be a low voltage.

A string selection line SSL may be floated from the point of time t1 when the erase voltage Vers starts to be applied. A voltage of the string selection line SSL may be increased by the coupling effect. The string selection transistor SST may be erase-inhibited.

At t2, the ground selection line GSL, the dummy word line DWL, and the word lines WL1 through WL3 of the first sub-block may be floated. Voltages of the ground selection line GSL, the dummy word line DWL, and the word lines WL1 through WL3 may be increased due to the coupling effect. The Fowler-Nordheim tunneling may not be generated at a ground selection transistor GST, a dummy memory cell DMC, and memory cells MC1 through MC3 of the first sub-block. The ground selection transistor GST, the dummy memory cell DMC, and the memory cells MC1 through MC3 may be erase-inhibited.

After t2, the Fowler-Nordheim tunneling may be generated at memory cells MC4 through MC6 of the second sub-block due to a difference between the erase voltage Vers and the selection word line voltage Vsw. Data of the memory cells MC4 through MC6 of the second sub-block may be erased.

Figure 12:
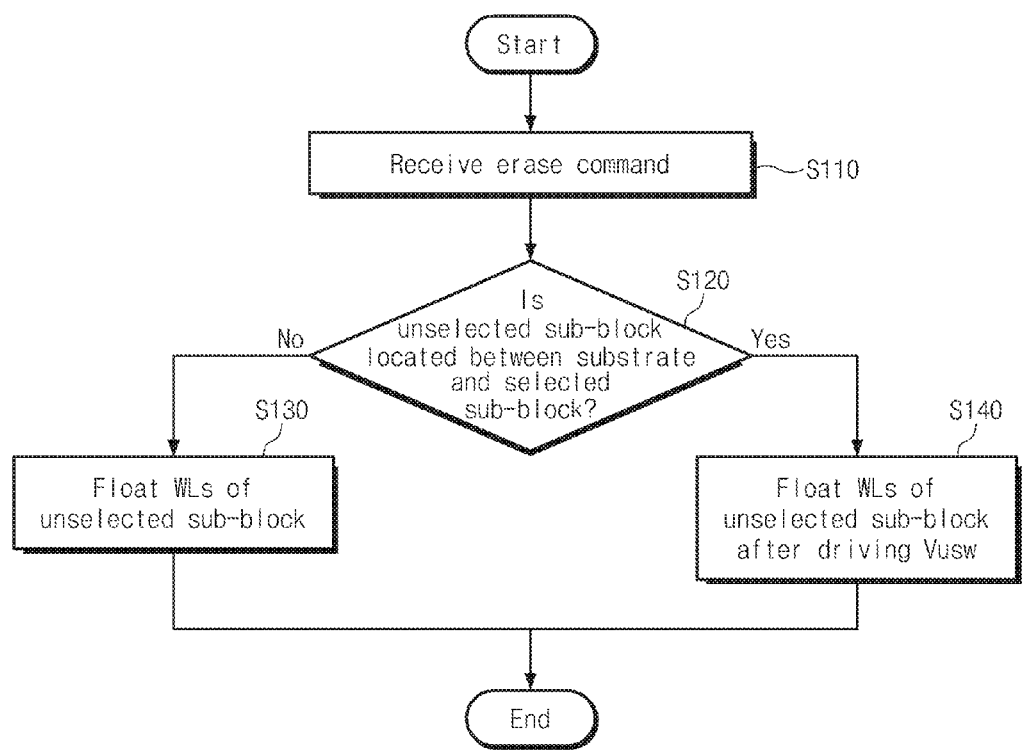
FIG. 12 is a flowchart for describing a method of controlling word lines connected with an unselected sub-block at an erase operation.

FIG. 12 is a flowchart for describing a method of controlling word lines connected with an unselected sub-block at an erase operation. Referring to FIGS. 1 and 12, in operation S110, an erase command may be received. Control logic 150 may receive a control signal CTRL provided as the erase command. Further, an address decoder 120 may receive an address ADDR appointing a sub-block to be erased. A sub-block corresponding to the address ADDR may be a selected sub-block. A sub-block not corresponding to the address ADDR may be an unselected sub-block.

In operation S120, there may be judged whether the unselected sub-block is located between a substrate 111 and the selected sub-block. That is, there may be judged whether the unselected sub-block is disposed to be closer than the substrate 111 as compared with the selected sub-block. The control logic 150 may judge whether the unselected sub-block is disposed to be closer than the substrate 111 as compared with the selected sub-block, based on the address ADDR.

In the event that the unselected sub-block is not located between the substrate 111 and the selected sub-block, the method proceeds to operation S130. In the event that the unselected sub-block is located between the substrate 111 and the selected sub-block, the method proceeds to operation S140.

In operation S130, word lines of the unselected sub-block may be floated. In an embodiment, a floating point of time may be equal to a point of time when an erase voltage Vers is supplied to a substrate 111.

In operation S140, after a non-selection word line voltage Vusw is supplied to word lines of the unselected sub-block, the word lines of the unselected sub-block may be floated. The address decoder 120 may supply the non-selection word line voltage Vusw to the word lines of the unselected sub-block. The address decoder 120 may float the word lines of the unselected sub-block after the erase voltage Vers is supplied and a specific delay time elapses. The control logic 150 may control a point of time when the word lines of the unselected sub-block are floated.

With the embodiment described in relation to FIG. 12, a floating point of time of word lines connected with the unselected sub-block may be determined according to a location of the unselected sub-block.

Figure 13:
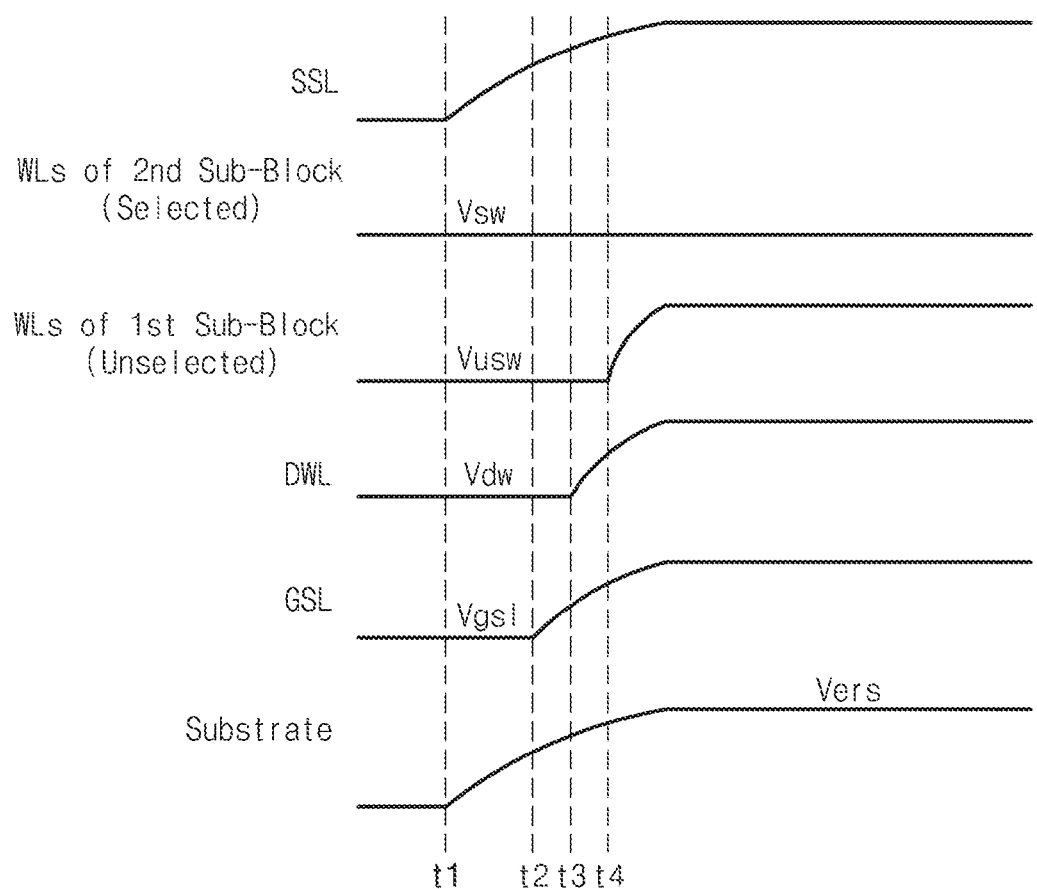
FIG. 13 is a timing diagram illustrating another embodiment of a voltage variation of a memory block according to a bias condition of FIG. 10.

FIG. 13 is a timing diagram illustrating another embodiment of a voltage variation of a memory block BLK1 according to a bias condition of FIG. 10. It is assumed that a first sub-block is an unselected sub-block and a second sub-block is a selected sub-block.

Referring to FIGS. 9, 10, and 13, a ground selection line GSL, a dummy word line DWL, and word lines WL1 through WL3 of the first sub-block may be floated at different points of time.

After receiving a ground selection line voltage Vgsl until t2, the ground selection line GSL may be floated. After receiving a dummy word line voltage Vdw until t3, the dummy word line DWL may be floated. After receiving a non-selection word line voltage Vusw until t4, the word lines WL1 through WL3 of the first sub-block may be floated. The time t3 may follow the time t2, and the time t4 may follow the time t3. The times t2 through t4 may be previously decided.

An erase voltage Vers supplied to a substrate 111 may be transferred to a surface layer 114 in a second direction. Between t1 and t2, the erase voltage Vers of the substrate 111 may be stably transferred to a surface layer corresponding to a ground selection transistor GST by applying a ground selection line voltage Vgsl to a ground selection line GSL. Between t2 and t3, the erase voltage Vers of a surface layer corresponding to the ground selection transistor GST may be stably transferred to a surface layer corresponding to a dummy memory cell DMC by applying a dummy word line voltage Vdw to a dummy word line DWL. Between t3 and t4, the erase voltage Vers of a surface layer corresponding to the dummy memory cell DMC may be stably transferred to a surface layer corresponding to memory cells MC1 through MC3 of an unselected sub-block by applying a non-selection word line voltage Vusw.

As a result, the erase voltage Vers of the substrate 111 may be efficiently transferred to the surface layer 114 by sequentially floating the ground selection line GSL, the dummy word line DWL, and the word lines WL1 through WL3 of the first sub-block.

Figure 14:
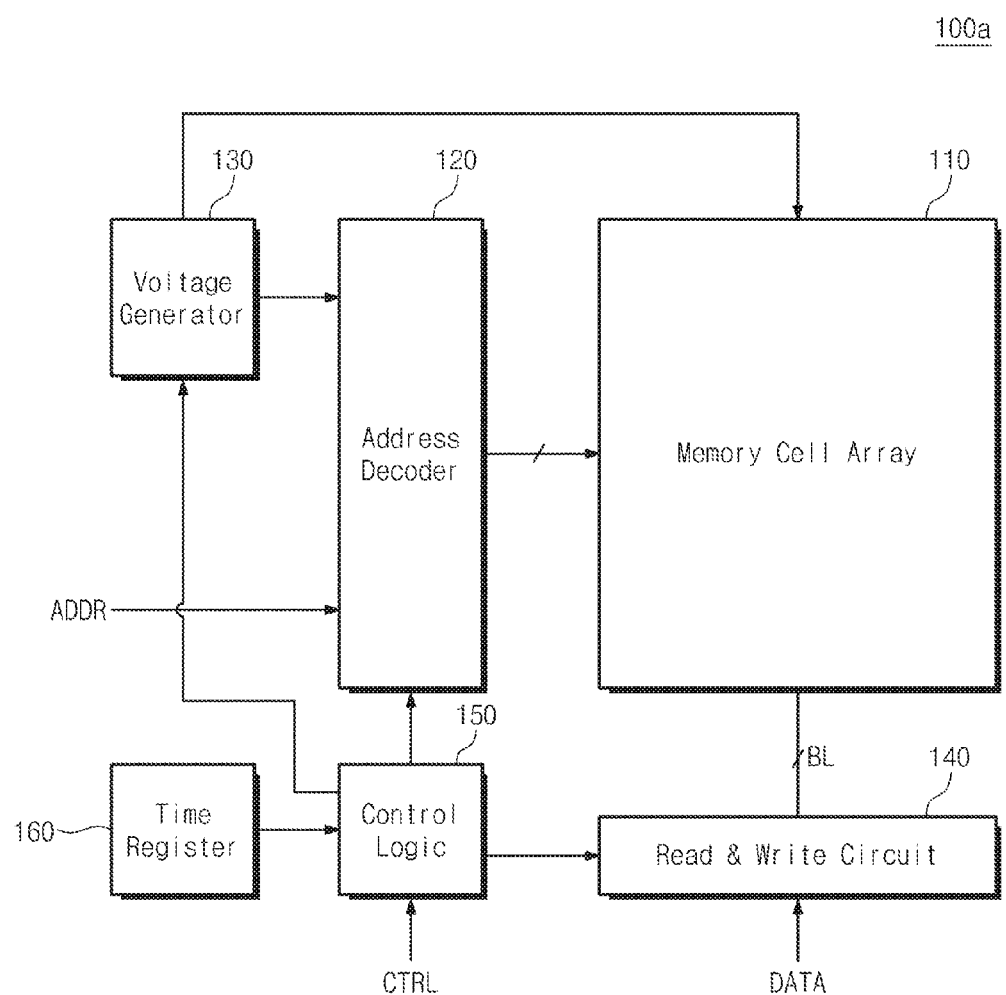
FIG. 14 is a block diagram schematically illustrating a nonvolatile memory according to another embodiment of the inventive concept.

FIG. 14 is a block diagram schematically illustrating a nonvolatile memory according to another embodiment of the inventive concept. Referring to FIG. 14, a nonvolatile memory 100a of this example includes a memory cell array 110, an address decoder 120, a voltage generator 130, a read and write circuit 140, control logic 150, and a time register 160.

The time register 160 may store time values. For example, the time values may be stored in the memory cell array 110.

At power-up of the nonvolatile memory 110a, the time values stored in the memory cell array 110 may be loaded onto the time register 160.

The time register 160 may store a difference value between a first time t1 and a second time t2, a difference value between the second time t2 and a third time t3, and a difference value between the third time t3 and a fourth time t4.

The control logic 150 may judge floating points of time of a ground selection line GSL, a dummy word line DWL, and word lines WL1 through WL3 of a first sub-block, based on the time values in the time register 160, and may control the address decoder 120 according to a judgment result.

Figure 15:
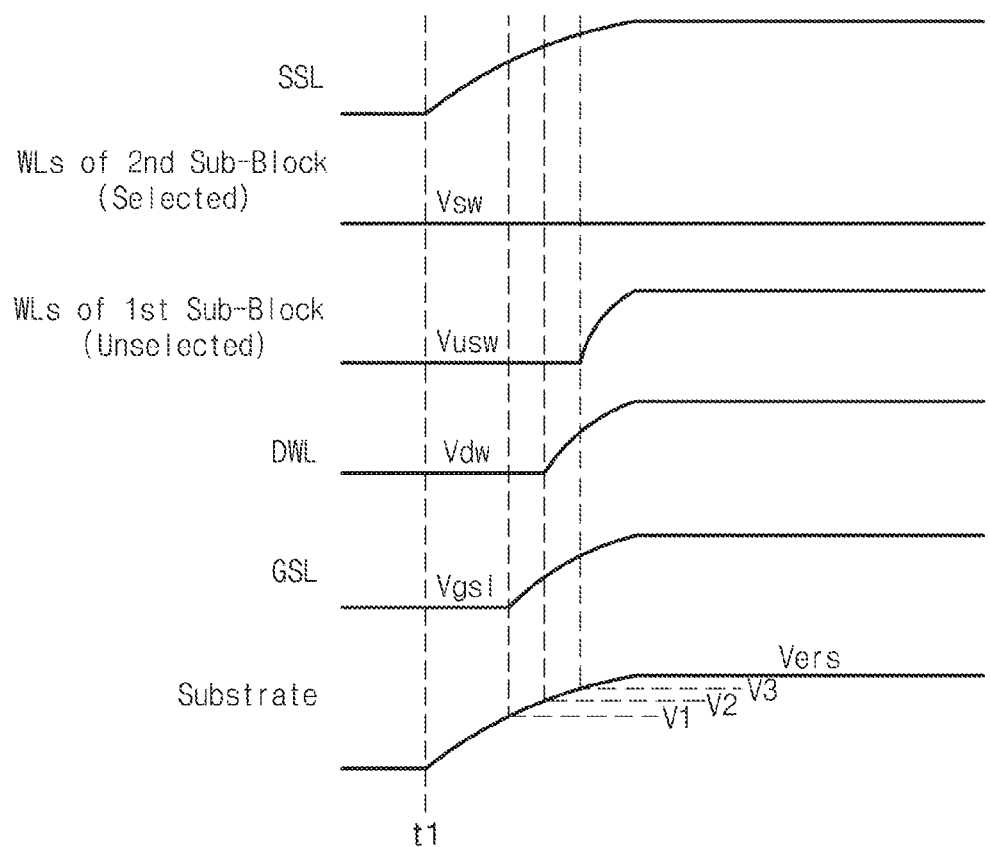
FIG. 15 is a timing diagram illustrating still another embodiment of a voltage variation of a memory block according to a bias condition of FIG. 10.

FIG. 15 is a timing diagram illustrating still another embodiment of a voltage variation of a memory block BLK1 according to a bias condition of FIG. 10. It is assumed that a first sub-block is an unselected sub-block and a second sub-block is a selected sub-block.

Referring to FIGS. 9, 10, and 15, floating points of time of a ground selection line GSL, a dummy word line DWL, and word lines WL1 through WL3 of the first sub-block may be decided according to a level of an erase voltage Vers.

The ground selection line GSL may be floated when the erase voltage Vers is over a first threshold voltage Vt1. The dummy word line DWL may be floated when the erase voltage Vers is over a second threshold voltage Vt2. The word lines WL1 through WL3 of the unselected sub-block may be floated when the erase voltage Vers is over a third threshold voltage Vt3. The first threshold voltage Vt1 may be lower than the second threshold voltage Vt2, and the second threshold voltage Vt2 may be lower than the third threshold voltage Vt3. The ground selection line GSL, the dummy word line DWL, and the word lines WL1 through WL3 of the unselected sub-block may be sequentially floated according to an increase in the erase voltage Vers.

Figure 16:
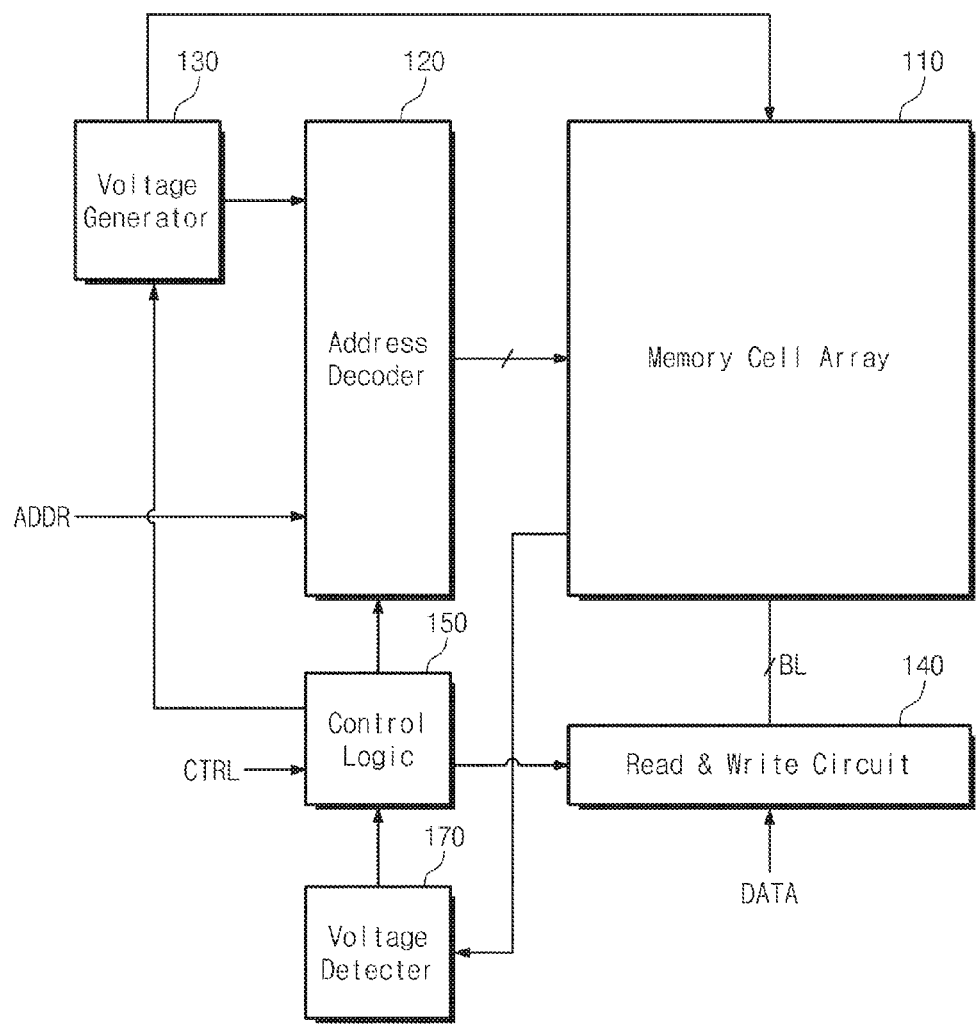
FIG. 16 is a block diagram schematically illustrating a nonvolatile memory according to still another embodiment of the inventive concept.

FIG. 16 is a block diagram schematically illustrating a nonvolatile memory according to still another embodiment of the inventive concept. Referring to FIG. 16, a nonvolatile memory 100b of this example includes a memory cell array 110, an address decoder 120, a voltage generator 130, a read and write circuit 140, control logic 150, and a voltage detector 170.

The voltage detector 170 may detect an erase voltage Vers supplied to a substrate 111 of the nonvolatile memory 110b. For example, the voltage detector 170 may detect whether the erase voltage Vers reaches first through third threshold voltages Vt1 through Vt3, respectively.

The control logic 150 may decide floating points of time of a ground selection line GSL, a dummy word line DWL, and word lines WL1 through WL3 of an unselected sub-block, according to a detection result of the voltage detector 170.

If the voltage detector 170 detects that the erase voltage Vers reaches the first threshold voltage Vt1, the control logic 150 may control the address decoder 120 such that the ground selection line GSL is floated. If the voltage detector 170 detects that the erase voltage Vers reaches the second threshold voltage Vt2, the control logic 150 may control the address decoder 120 such that the dummy word line DWL is floated. If the voltage detector 170 detects that the erase voltage Vers reaches the third threshold voltage Vt3, the control logic 150 may control the address decoder 120 such that the word lines WL1 through WL3 of an unselected sub-block are floated.

Figure 17:
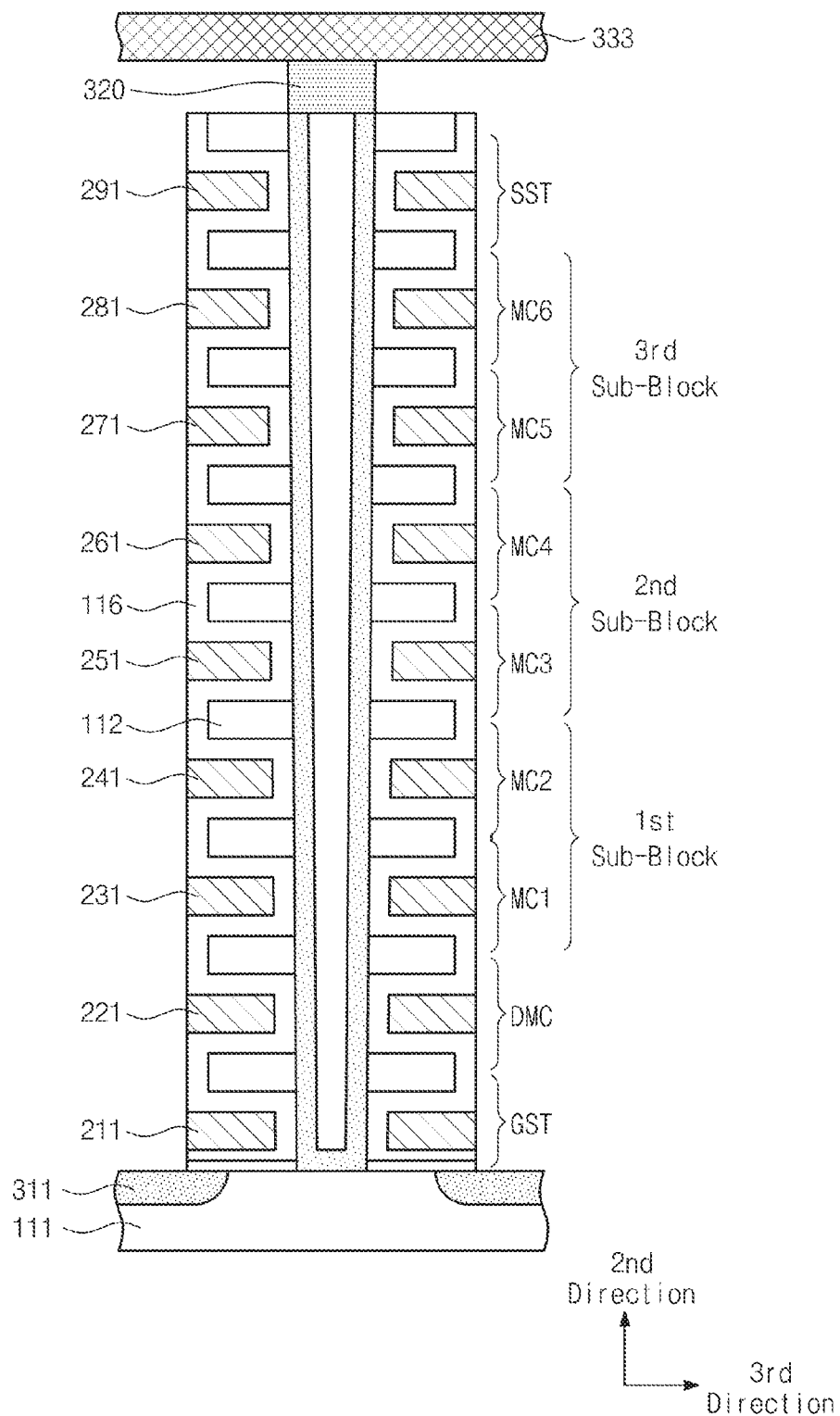
FIG. 17 is a diagram illustrating an embodiment in which memory cells of one NAND string are included within three sub-blocks.

FIG. 17 is a diagram illustrating an embodiment in which memory cells MC of one NAND string NS11 are included within three sub-blocks. Referring to FIG. 17, a ground selection transistor GST, a dummy memory cell DMC, first through sixth memory cells MC1 through MC6, and a string selection transistor SST may be sequentially stacked on a substrate 111.

The memory cells MC1 and MC2 having third and fourth nominal heights may be included within a first sub-block. The memory cells MC3 and MC4 having fifth and sixth nominal heights may be included within a second sub-block. The memory cells MC5 and MC6 having seventh and eighth nominal heights may be included within a third sub-block.

Like memory cells of the NAND string NS11, memory cells of the remaining NAND strings of a first memory block BLK1 may be included within the first through third sub-blocks. Accordingly, the first memory block BLK1 may include three sub-blocks.

Figure 18:
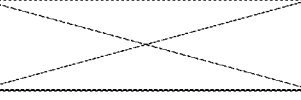
FIG. 18 is a table illustrating an embodiment of a bias condition in the event that memory cells of a memory block are included within three sub-blocks.

FIG. 18 is a table illustrating an embodiment of a bias condition in the event that memory cells of a memory block BLK1 are included within three sub-blocks. Below, it is assumed that data of a second sub-block is erased. In this case, first and third sub-blocks may be unselected and a second sub-block may be selected.

In accordance with an embodiment of FIG. 18, lines GSL, DWL, WL1, and WL2 connected with regions GST, DMC, MC1, and MC2 adjacent to a substrate 111 than a selected sub-block may be floated after an erase voltage Vers is applied and a specific delay time elapses. Lines WL5, WL6, and SSL connected with regions MC5, MC6, and SST far from the substrate than the selected sub-block may be floated when the erase voltage Vers is supplied to the substrate 111.

Referring to FIGS. 7, 17, and 18, the erase voltage Vers is supplied to the substrate 111.

When the erase voltage Vers is supplied, a selection word line voltage Vsw may be applied to word lines WL3 and WL4 of the second sub-block.

Before a ground selection line GSL and a dummy word line DWL are floated, a ground selection line voltage Vgsl and a dummy word line voltage Vdw may be supplied to the ground selection line GSL and the dummy word line DWL, respectively. Before word lines WL1 and WL2 of the first sub-block are floated, a non-selection word line voltage Vusw may be provided to the word lines WL1 and WL2 of the first sub-block.

Word lines WL5 and WL6 of the third sub-block and a string selection line SSL may be floated.

Figure 19:
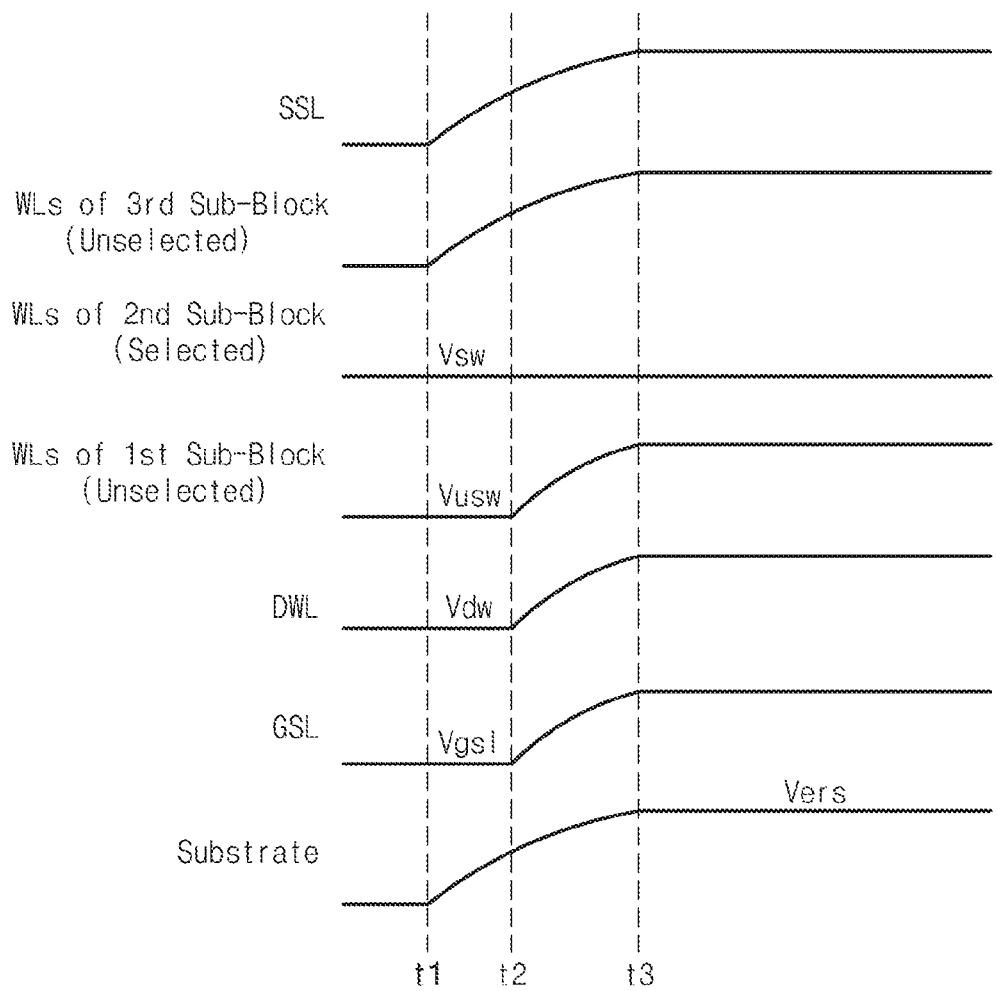
FIG. 19 is a timing diagram illustrating a voltage variation of a memory block according to a bias condition of FIG. 18.

FIG. 19 is a timing diagram illustrating a voltage variation of a memory block BLK1 according to a bias condition of FIG. 18. Referring to FIGS. 17 through 19, at t1, an erase voltage may be supplied to a substrate 111. Further, at t1, word lines WL5 and WL5 of a third sub-block and a string selection line SSL may be floated. Voltages of the word lines WL5 and WL5 and the string selection line SSL may be increased due to the coupling effect.

Between t1 and t2, a ground selection line voltage Vgsl and a dummy word line voltage Vdw may be applied to a ground selection line GSL and a dummy word line DWL, respectively. Also, a non-selection word line voltage Vusw may be applied to word lines WL1 and WL2 of the first sub-block, respectively.

The ground selection line voltage Vgsl, the dummy word line voltage Vdw, and the non-selection word line voltage Vusw may be a low voltage. A difference between each of the voltages Vgsl, Vdw, and Vusw and the erase voltage Vers may be maintained. Accordingly, the erase voltage Vers increasing may be stably transferred to a surface layer corresponding to memory cells MC3 and MC4 of the second sub-block.

A ground selection line GSL, a dummy word line DWL, and word lines WL1 and WL2 of the first sub-block may be floated at t2. Voltages of the ground selection line GSL, the dummy word line DWL, and the word lines WL1 and WL2 of the first sub-block may be increased due to the coupling effect. A ground selection transistor GST, a dummy memory cell DMC, and memory cells MC1 and MC2 of the first sub-block may be erase-inhibited.

Figure 20:
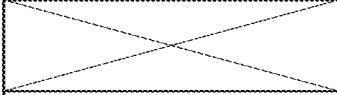
FIG. 20 is a table illustrating another embodiment of a bias condition in the event that memory cells of a memory block are included within three sub-blocks.

FIG. 20 is a table illustrating another embodiment of a bias condition in the event that memory cells of a memory block BLK1 are included within three sub-blocks. An embodiment of FIG. 20 may be different from that of FIG. 18 in that lines WL5, WL6, and SSL connected with regions MC5, MC6, and SST far from a substrate 111 than a selected sub-block are floated after an erase voltage Vers is applied to the substrate 111 and a specific delay time elapses.

Referring to FIG. 20, a string selection line SSL and word lines WL5 and WL6 of a third sub-block may be floated after a specific delay time from a point of time when the erase voltage Vers is applied. After supplied with a string selection line voltage Vss1, the string selection line SSL may be floated. After supplied with a non-selection word line voltage Vusw, the word lines WL5 and WL6 of the third sub-block may be floated.

A plurality of bit lines BL1 through BLm may be connected to a plurality of memory blocks BLK1 through BLKz (refer to FIG. 3). It is assumed that the plurality of memory blocks BLK1 through BLKz are disposed on one substrate 111. At this time, the erase voltage Vers supplied to the substrate 111 may be transferred to NAND strings of a first memory block BLK1 via the bit lines BL1 through BLm and NAND strings of the remaining memory blocks (e.g., BLKz).

The plurality of bit lines BL1 through BLm may be connected to a plurality of NAND strings (refer to FIGS. 3 and 7). The erase voltage Vers supplied to the substrate 111 may be transferred to NAND strings NS11 via other NAND strings (e.g., NS21 and NS31) and a bit line (e.g., BL1).

With the embodiment of FIG. 20, the erase voltage Vers transferred via a bit line may be stably transferred to a surface layer 114 by applying low voltages to a string selection line SSL and word lines WL5 and WL6 of the third sub-block.

FIG. 21 is a table illustrating still another embodiment of a bias condition in the event that memory cells of a memory block BLK1 are included within three sub-blocks. An embodiment of FIG. 21 may be different from that of FIG. 18 in that word lines WL5 and WL6 of a third sub-block are floated at different points of time.

Referring to FIG. 21, the fifth word line WL5 may be floated after a specific delay time from a point of time when an erase voltage Vers is applied. After supplied with a non-selection word line voltage Vusw after a specific delay time, the fifth word line WL5 may be floated. The sixth word line WL6 may be floated from a point of time when the erase voltage Vers is applied.

It is assumed that the fifth word line WL5 is floated from a point of time when the erase voltage Vers is applied. A voltage of the fifth word line WL5 may be increased according to an increase in the erase voltage Vers. The increased voltage of the fifth word line WL5 may affect an erase operation of a second sub-block. For example, the coupling between the fifth word line WL5 and the second sub-block may become larger due to the increased voltage of the fifth word line WL5.

With the embodiment of FIG. 21, a word line WL5 of a third sub-block adjacent to a second sub-block may be supplied with a non-selection word line voltage Vusw during a specific delay time. Word lines WL3 and WL4 of a second sub-block may be supplied with a selection word line voltage Vsw. The non-selection word line voltage Vusw and the selection word line voltage Vsw may be a low voltage. For example, the non-selection word line voltage Vusw and the selection word line voltage Vsw may be a ground voltage. The coupling between the second sub-block and the third sub-block may be reduced by applying the non-selection word line voltage Vusw to the word line WL5 adjacent to the second sub-block. Accordingly, the reliability of an erase operation on the second sub-block may be bettered.

In FIG. 21, there is illustrated the case that floating points of time of the word lines WL5 and WL6 of the third sub-block are different. However, like the third sub-block, floating points of time of word lines WL1 and WL2 of a first sub-block can be controlled differently. For example, the second word line WL2 may be floated after a specific delay time from a point of time when the erase voltage Vers is applied. The first word line WL1 may be floated from a point of time when the erase voltage Vers is applied.

FIG. 22 is a table illustrating still another embodiment of a bias condition in the event that memory cells of a memory block BLK1 are included within three sub-blocks. Referring to FIG. 22, after supplied with a non-selection word line voltage Vusw, word lines of unselected sub-blocks (e.g., first and third sub-blocks) may be supplied with a specific voltage.

The non-selection word line voltage Vusw may be applied to word lines WL1 and WL2 of the first sub-block. To prevent the Fowler-Nordheim tunneling, a first voltage V1 may be supplied to the word lines WL1 and WL2 of the first sub-block.

The non-selection word line voltage Vusw may be applied to word lines WL5 and WL6 of the third sub-block. To prevent the Fowler-Nordheim tunneling, a second voltage V2 may be supplied to the word lines WL5 and WL6 of the third sub-block.

In an embodiment, the first voltage V1 may be equal to voltages of the word lines WL1 and WL2 of the first sub-block when the word lines WL1 and WL2 of the first sub-block are floated. The second voltage V2 may be equal to voltages of the word lines WL5 and WL6 of the third sub-block when the word lines WL5 and WL6 of the third sub-block are floated.

Figure 23:
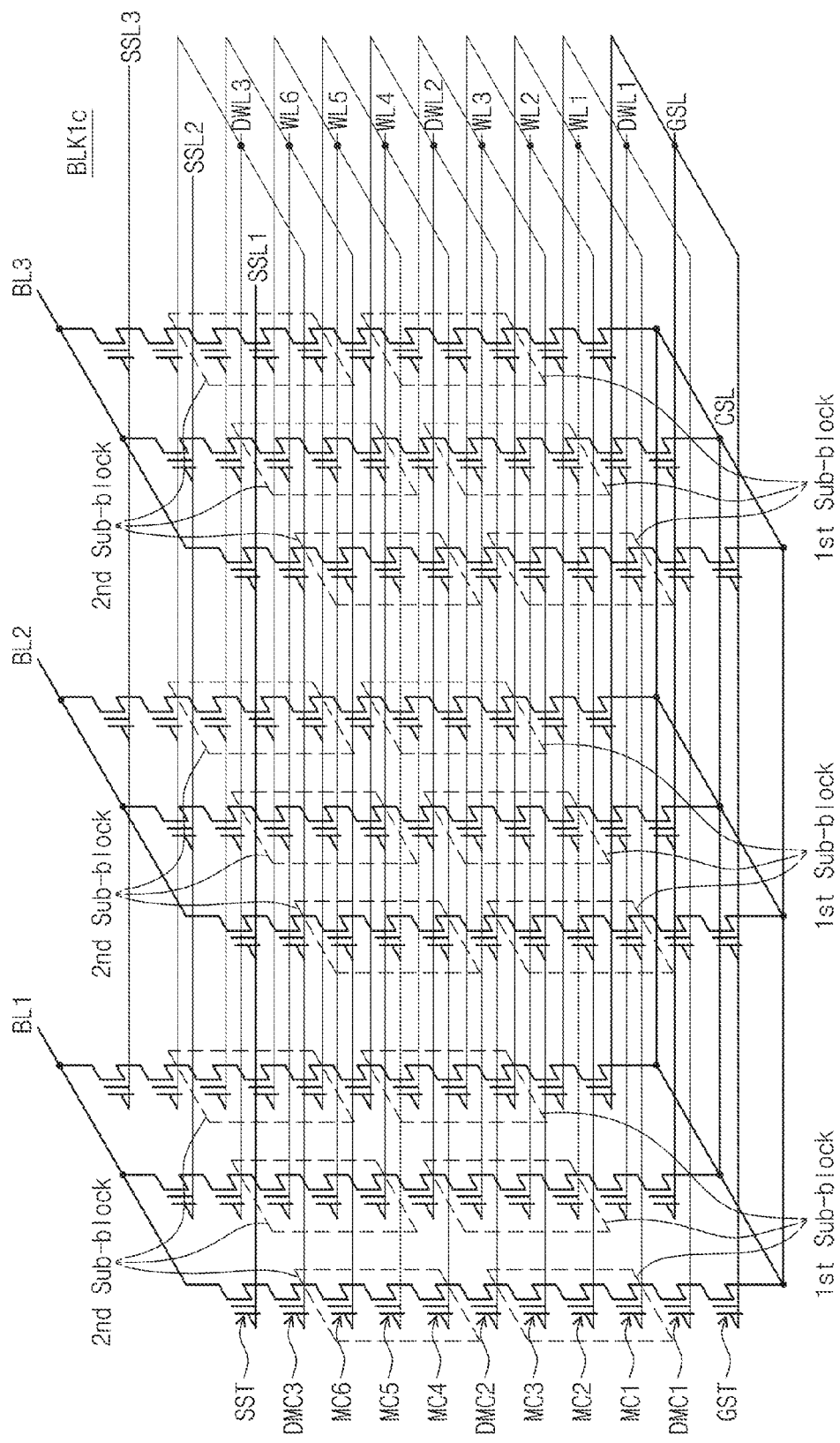
FIG. 23 is a circuit diagram illustrating an equivalent circuit of one of memory blocks according to another embodiment of the inventive concept.

FIG. 23 is a circuit diagram illustrating an equivalent circuit BLK1c of one BLK1 of memory blocks BLK1 through BLKz according to another embodiment of the inventive concept. Referring to FIG. 23, one NAND string may include a ground selection transistor GST, a first dummy memory cell DMC1, first through third memory cells MC1 through MC3, a second dummy memory cell DMC2, fourth through sixth memory cells MC4 through MC6, a third dummy memory cell DMC3, and a string selection transistor which are sequentially disposed from a substrate 111 (refer to FIGS. 4 and 5).

In each NAND string, the first through third memory cells MC1 through MC3 may constitute a first sub-block, and the fourth through sixth memory cells MC4 through MC6 may constitute a second sub-block.

One NAND string may include three dummy memory cells DMC1, DMC2, and DMC3. The dummy memory cell DMC1 may be disposed between the ground selection transistor GST and the first sub-block, the dummy memory cell DMC2 between the first sub-block and the second sub-block, and the dummy memory cell DMC3 between the second sub-block and a string selection transistor SST.

FIG. 24 is a table illustrating a bias condition on an equivalent circuit BLK1c of FIG. 23 when a first sub-block is unselected and a second sub-block is selected.

Referring to FIGS. 23 and 24, at an erase operation, an erase voltage Vers may be supplied to a substrate 111 (refer to FIGS. 4 and 5), and a selection word line voltage Vsw may be supplied to word lines of a second sub-block.

Lines GSL, DWL1, WL1 through WL3, and DWL2 connected to a region adjacent to the substrate 111 than a selected sub-block may be floated after a specific delay time from a point of time when the erase voltage Vers is supplied to the substrate 111.

Floating points of time of lines DWL3 and SSL connected to a region far from the substrate 111 than the selected sub-block may be decided selectively. For example, the lines DWL3 and SSL connected to a region far from the substrate 111 than the selected sub-block may be floated from a point of time when the erase voltage Vers is supplied to the substrate 111. Alternatively, the lines DWL3 and SSL connected to a region far from the substrate 111 than the selected sub-block may be floated after a specific delay time from a point of time when the erase voltage Vers is supplied to the substrate 111.

FIG. 25 is a table illustrating a bias condition on an equivalent circuit BLK1c of FIG. 23 when a first sub-block is selected and a second sub-block is unselected.

Referring to FIGS. 23 and 25, at an erase operation, an erase voltage Vers may be supplied to a substrate 111 (refer to FIGS. 4 and 5), and a selection word line voltage Vsw may be supplied to word lines of a first sub-block.

Lines GSL and DWL1 connected to a region adjacent to the substrate 111 than a selected sub-block may be floated after a specific delay time from a point of time when the erase voltage Vers is supplied to the substrate 111. Floating points of time of lines DWL2, WL4 through WL6, DWL3, and SSL connected to a region far from the substrate 111 than the selected sub-block may be decided selectively.

Figure 26:
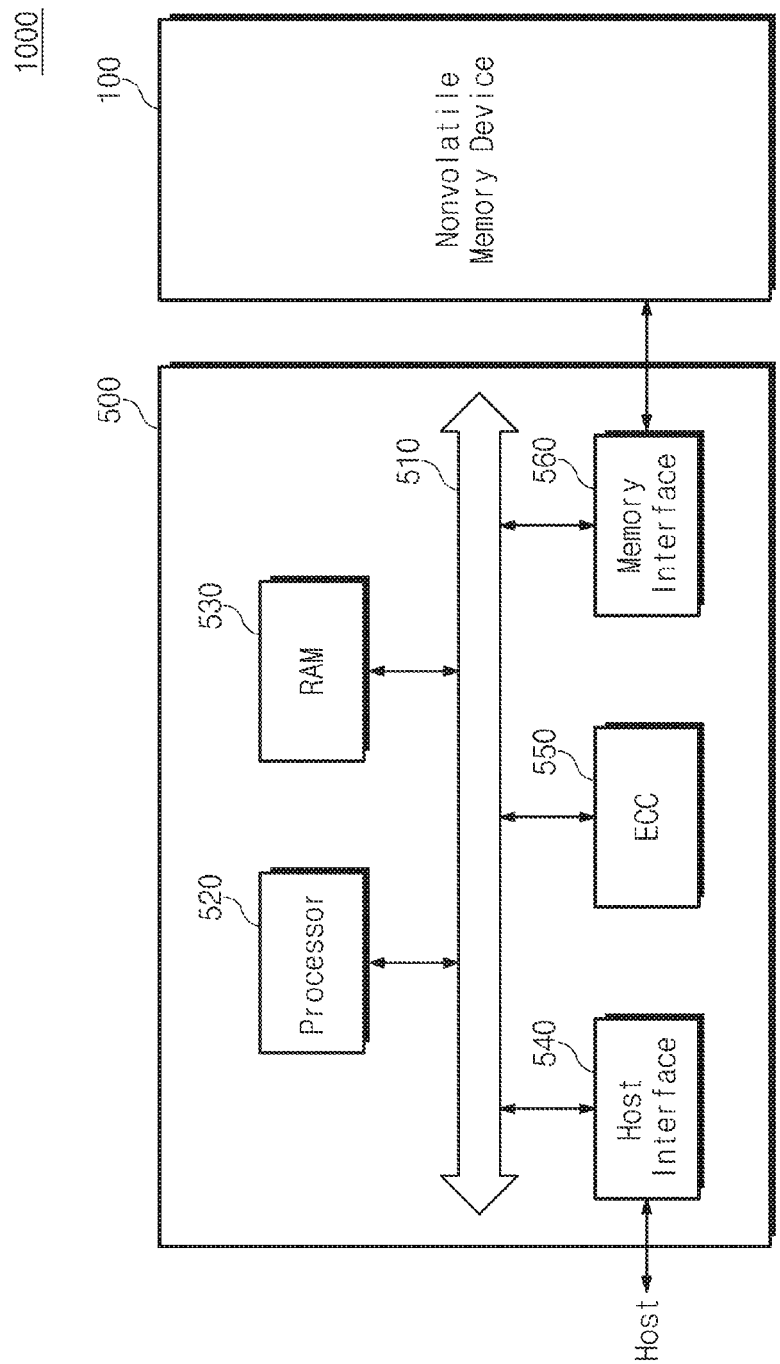
FIG. 26 is a block diagram illustrating a memory system according to an embodiment of the inventive concept.

FIG. 26 is a block diagram illustrating a memory system according to an embodiment of the inventive concept. Referring to FIG. 26, a memory system 1000 may include a nonvolatile memory 100 and a controller 500.

The controller 500 may be coupled with a host and the nonvolatile memory 100. The controller 500 may be configured to access the nonvolatile memory 100 in response to a request from the host. The controller 500 may be configured to control read, program, erase, and background operations of the nonvolatile memory 100, for example. The controller 500 may be configured to provide an interface between the nonvolatile memory 100 and the host. The controller 500 may be configured to drive firmware for controlling the nonvolatile memory 100.

The controller 500 may include an internal bus 510, a processor 520, a RAM 530, a host interface 540, an ECC block 550, and a memory interface 560. The internal bus 510 may provide a channel among constituent elements of the controller 500.

The processor 520 may control an overall operation of the controller 500. For example, the processor 520 may be configured to drive firmware, code, and the like which are driven at the controller 500. For example, the processor 520 may be configured to drive firmware, code, and the like which are used to control the nonvolatile memory 100.

The RAM 530 may be used as at least one of a working memory of the processor 530, a cache memory between the nonvolatile memory 100 and the host or a buffer memory between the nonvolatile memory 100 and the host.

The host interface 540 may include the protocol for executing data exchange between the host and the controller 500. Exemplarily, the host interface 540 may communicate with an external device (e.g., the host) via at least one of various protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, and an IDE (Integrated Drive Electronics) protocol.

The ECC block 550 may include an Error Correcting Code (ECC).

The ECC block 550 may be configured to detect and correct an error of data read from the nonvolatile memory 100 using the ECC.

The memory interface 560 may interface with the nonvolatile memory 100. The memory interface 560 may include a NAND interface or a NOR interface, for example.

The controller 500 and the nonvolatile memory 100 may be integrated in a single semiconductor device. The controller 500 and the nonvolatile memory 100 may be integrated in a single semiconductor device to form a memory card. For example, the controller 500 and the nonvolatile memory device 100 may be integrated in a single semiconductor device to form a memory card such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, or the like.

The controller 500 and the nonvolatile memory 100 may be integrated in a single semiconductor device to form a solid state drive (SSD). The SSD may include a storage device configured to store data in a semiconductor memory. If the memory system 1000 is used as the SSD, it is possible to substantially improve an operating speed of a host coupled with the memory system 1000.

In some embodiments, the memory system 1000 may be used as computer, portable computer, Ultra Mobile PC (UMPC), workstation, net-book, PDA, web tablet, wireless phone, mobile phone, smart phone, e-book, PMP (portable multimedia player), digital camera, DMB (Digital Multimedia Broadcasting) player, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

In an exemplary embodiment, a nonvolatile memory 1100 or a memory system 1000 may be packaged in accordance with a variety of package technologies such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

Figure 27:
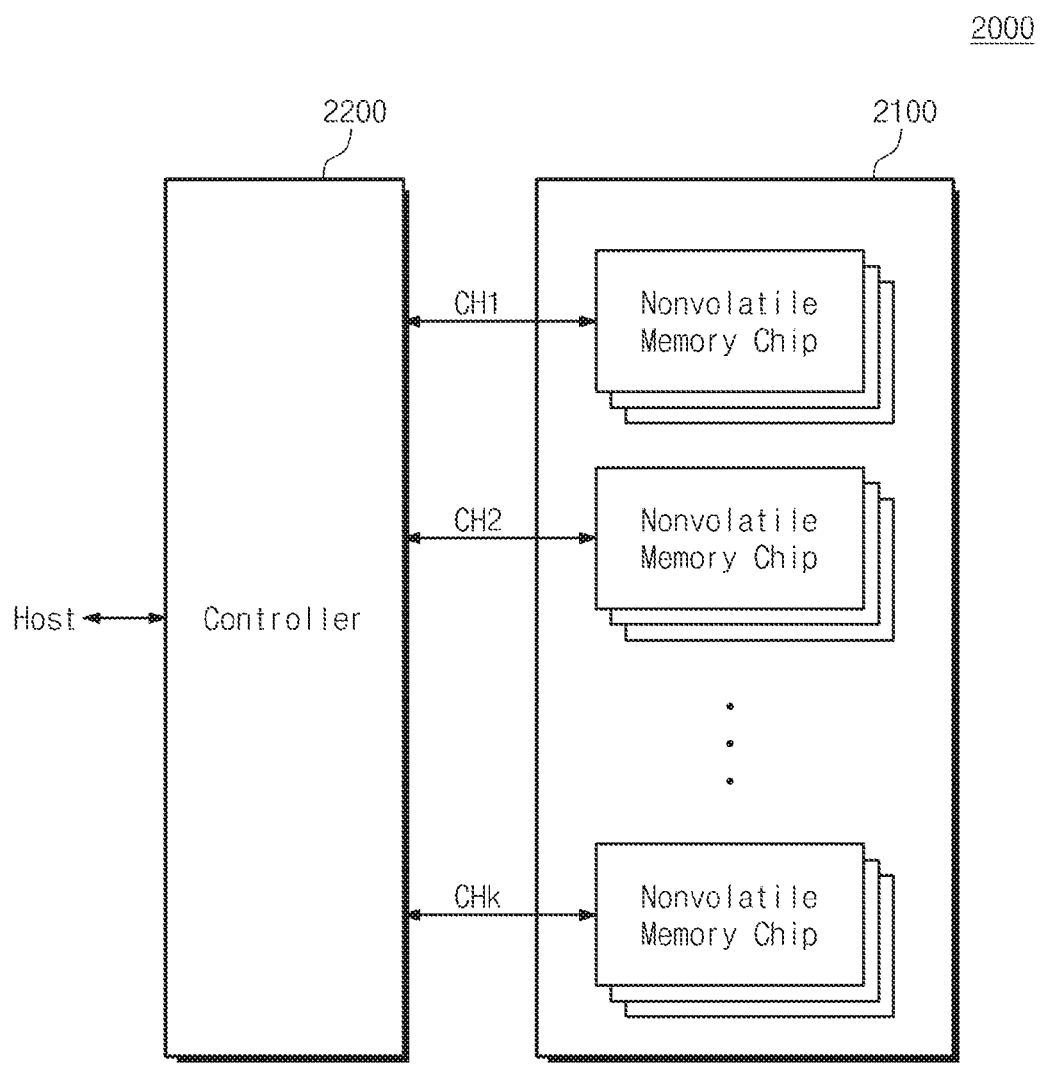
FIG. 27 is a block diagram illustrating an application of a memory system in FIG. 26.

FIG. 27 is a block diagram illustrating an application of a memory system in FIG. 26. Referring to FIG. 27, a memory system 2000 may include a nonvolatile memory 2100 and a controller 2200. The nonvolatile memory 2100 may include a plurality of nonvolatile memory chips. The plurality of nonvolatile memory chips may be classified into a plurality of groups. Nonvolatile memory chips in each group may communicate with the controller 2200 via a common channel In FIG. 27, there is illustrated the case that a plurality of memory chips communicates with the controller 2200 via plural channels CH1 through CHk. Each nonvolatile memory chip may be configured to operate the same as one of nonvolatile memories 100 and 500 described in relation to FIGS. 1 and 26.

As illustrated in FIG. 27, one channel may be connected with a plurality of nonvolatile memory chips. However, the memory system 2000 may be modified such that one channel is connected with one nonvolatile memory chip.

Figure 28:
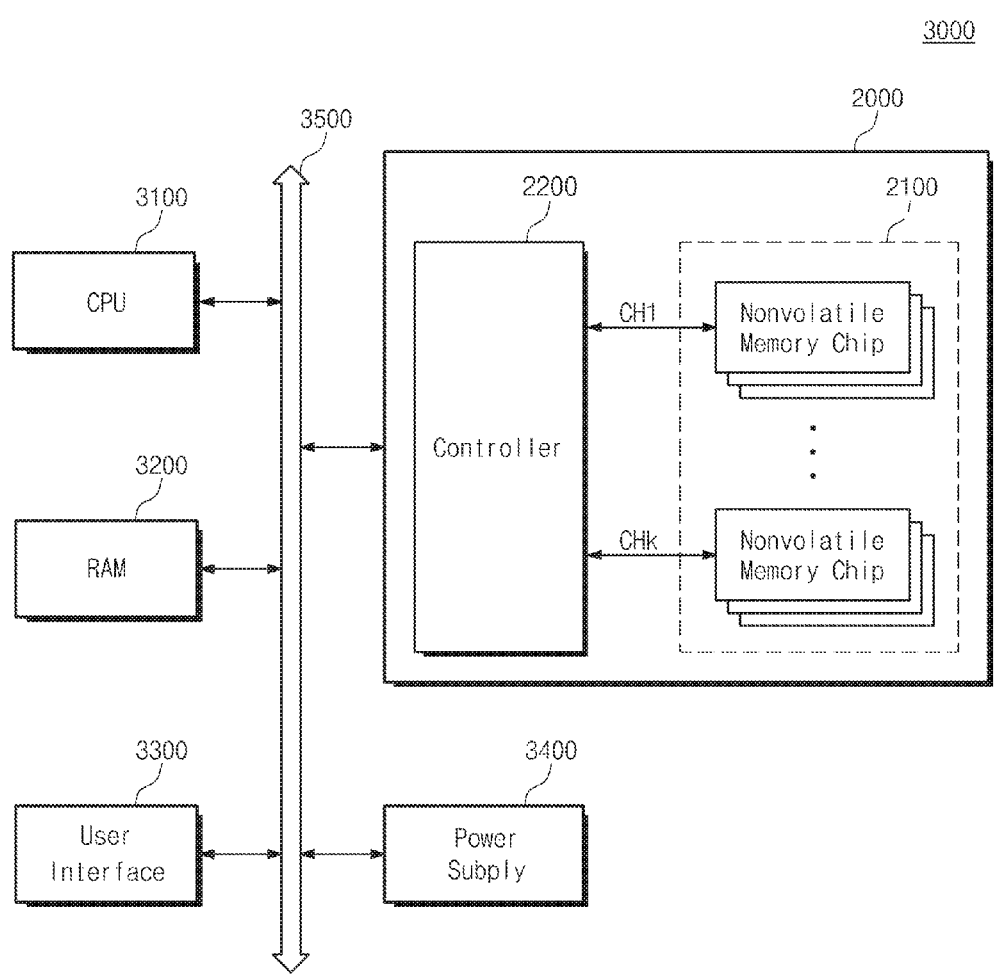
FIG. 28 is a block diagram illustrating a computing system including a memory system described in FIG. 27.

FIG. 28 is a block diagram illustrating a computing system including a memory system described in FIG. 27. Referring to FIG. 28, a computing system 3000 may include a CPU 3100, a RAM 3200, a user interface 3300, a power supply 3400, and a memory system 2000.

The memory system 2000 may be electrically connected with the CPU 3100, the RAM 3200, the user interface 3300, and the power supply 3400 via a system bus 3500. Data provided via the user interface 3300 or processed by the CPU 3100 may be stored in the memory system 2000.

As illustrated in FIG. 28, a nonvolatile memory 2100 may be connected with a system bus 3500 via a controller 2200. However, the nonvolatile memory 2100 can be connected directly with the system bus 3500. At this time, a function of the controller 2200 may be executed by the CPU 3100.

The memory system 2000 in FIG. 28 may be a memory system described in relation to FIG. 27. However, the memory system 2000 can be replaced with a memory system 1000 described in relation to FIG. 26. In an embodiment, the computing system 3000 may be configured to include all memory systems 1000 and 2000 described in relation to FIGS. 26 and 27.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of erasing a nonvolatile memory device which includes a plurality of memory cell strings including a first memory cell string, the first memory cell string including a first ground selection transistor, a plurality of nonvolatile memory cells and a first dummy memory cell, the first ground selection transistor being connected to a source line, and the plurality of memory cells and the first dummy memory cell being stacked on or above a substrate in a direction that is perpendicular to the substrate, the method comprising:
generating an erase voltage that begins to rise at a first time point, the erase voltage being supplied to a channel of the first memory cell string;
supplying a first voltage to a ground selection line connected to the first ground selection transistor and a second voltage to a first dummy word line connected to the first dummy memory cell while the erase voltage rises from the first time point; then
floating the ground selection line at a second time point that is later than the first time point; and
floating the first dummy word line at a third time point that is later than the second time point.

2. The method of claim 1, wherein between the first time point and the third time point, the erase voltage continues to rise,
the first voltage is supplied to the ground selection line between the first time point and the second time point, and
the second voltage is supplied to the first dummy word line between the first time point and the third time point.

3. The method of claim 2, wherein the first dummy memory cell is disposed between the first ground selection transistor and the plurality of nonvolatile memory cells.

4. The method of claim 3, further comprising supplying a plurality of third voltages to a plurality of word line connected to the plurality of memory cells respectively during the erase voltage being supplied to the channel of the first memory cell string.

5. The method of claim 1, wherein a level of the first voltage and a level of the second voltage are equal to a level of a ground voltage.

6. The method of claim 4, wherein the erase voltage is maintained at a target level from a fourth time point that is later than the third time point.

7. The method of claim 6, further comprising floating a second dummy word line at the third time point, the second dummy word line being connected to a second dummy memory cell that is included in the first memory cell string.

8. The method of claim 6, further comprising floating a second dummy word line after the second time point, the second dummy word line being connected to a second dummy memory cell that is included in the first memory cell string.

9. The method of claim 7, wherein the first memory cell string is connected to a first bit-line,
the plurality of memory cell strings includes a second memory cell string that is connected to the first bit-line, and
a second ground selection transistor included in the second memory cell string is connected to the ground selection line.

10. A method of erasing a nonvolatile memory device which includes a plurality of memory cell strings including a first memory cell string, the first memory cell string including a first ground selection transistor, a plurality of nonvolatile memory cells and a first dummy memory cell, the first ground selection transistor being connected to a source line, and the plurality of memory cells and the first dummy memory cell being stacked on or above a substrate in a direction that is perpendicular to the substrate, the method comprising:
supplying an erase voltage that begins to rise at a first time point to the substrate;
supplying a first voltage to a ground selection line connected to the first ground selection transistor and a second voltage to a first dummy word line connected to the first dummy memory cell while the erase voltage rises from the first time point;
floating the ground selection line at a second time point that is later than the first time point; and floating the dummy word line at a third time point that is later than the second time point.

11. The method of claim 10, wherein between the first time point and the third time point, the erase voltage continues to rise, the first voltage is supplied to the ground selection line between the first time point and the second time point, and the second voltage is supplied to the first dummy word line between the first time point and the third time point.

12. The method of claim 11, wherein the first dummy memory cell is disposed between the first ground selection transistor and the plurality of nonvolatile memory cells.

13. The method of claim 12, further comprising supplying a plurality of third voltages to a plurality of word line connected to the plurality of memory cells respectively during the erase voltage being supplied to the channel of the first memory cell string.

14. The method of claim 10, wherein a level of the first voltage and a level of the second voltage are equal to a level of a ground voltage.

15. The method of claim 13, wherein the erase voltage is maintained at a target level from a fourth time point that is later than the third time point.

16. The method of claim 15, further comprising floating a second dummy word line at the third time point, the second dummy word line being connected to a second dummy memory cell that is included in the first memory cell string.

17. The method of claim 15, further comprising floating a second dummy word line after the second time point, the second dummy word line being connected to a second dummy memory cell that is included in the first memory cell string.

18. The method of claim 16, wherein the first memory cell string is connected to a first bit-line, the plurality of memory cell strings includes a second memory cell string that is connected to the first bit-line, and a second ground selection transistor included in the second memory cell string is connected to the ground selection line.

19. A nonvolatile memory device comprising:

a memory cell array including a plurality of memory cell strings including a first memory cell string, the first memory cell string including a first ground selection transistor, a plurality of nonvolatile memory cells and a first dummy memory cell, the first ground selection transistor being connected to a source line, and the plurality of memory cells and the first dummy memory cell being stacked on or above a substrate in a direction that is perpendicular to the substrate;

a voltage generator configured to generate an erase voltage supplied to a channel of the first memory cell string, the erase voltage rising from a first level;

an address decoder configured to supply a first voltage to a ground selection line connected to the first ground selection transistor and a second voltage to a first dummy word line connected to the first dummy memory cell;

a time register configured to store a first and a second time values; and a control logic configured to determine a first time point of floating the ground selection line based on the first time value and to determine a second time point of floating the dummy word line based on the second time value, configured to generate one or more control signals based on the first time point and the second time point, and configured to send the one or more control signals to the address decoder, wherein the address decoder is configured to float the ground selection line and the dummy word line in response to the one or more control signals while the erase voltage rises from the first level, and the second time point is later than the first time point.

20. The nonvolatile memory device of claim 19, wherein between the first time point and the third time point, the erase voltage continues to rise, the first voltage is supplied to the ground selection line between the first time point and the second time point, and the second voltage is supplied to the first dummy word line between the first time point and the third time point.

21. The nonvolatile memory device of claim 20, wherein the first dummy memory cell is disposed between the first ground selection transistor and the plurality of nonvolatile memory cells.

22. The nonvolatile memory device of claim 21, wherein the address decoder configured to supply a plurality of third voltages to a plurality of word line connected to the plurality of memory cells respectively during the erase voltage being supplied to the channel of the first memory cell string.

23. The nonvolatile memory device of claim 22, wherein the erase voltage is maintained at a target level from a fourth time point that is later than the third time point.

24. The nonvolatile memory device of claim 23, the address decoder configured to float a second dummy word line after the second time point, the second dummy word line being connected to a second dummy memory cell that is included in the first memory cell string.

25. The nonvolatile memory device of claim 24, wherein the first memory cell string is connected to a first bit-line, the plurality of memory cell strings includes a second memory cell string that is connected to the first bit-line, and a second ground selection transistor included in the second memory cell string is connected to the ground selection line.

26. A memory system comprising:

a memory controller configured to provide a erase command and an address; and a memory cell array comprising a plurality of memory cell strings including a first memory cell string, the first memory cell string including a first ground selection transistor, a plurality of nonvolatile memory cells, a first dummy memory cell that is disposed between the first ground selection transistor and the plurality of nonvolatile memory cells and a second dummy memory cell, the first ground selection transistor being connected to a source line, and the plurality of memory cells, the first dummy memory cell and the second dummy memory cell being connected in series and stacked on or above a substrate in a direction that is perpendicular to the substrate, a voltage generator configured to generate an erase voltage in response to the erase command, the erase voltage being supplied to a channel of the first memory cell string corresponding to the address, the erase voltage rising from a first level; an address decoder configured to supply a first voltage to a ground selection line connected to the first ground selection transistor, to supply a second voltage to a first dummy word line connected to the first dummy memory cell and to supply a plurality of third voltages to a plurality of word lines connected to the plurality of memory cells respectively;

a time register configured to store a first and a second time values; and a control logic configured to determine a first time point of floating the ground selection line based on the first time value and to determine a second time point of floating the dummy word line based on the second time value, configured to generate one or more control signals based on the first time point and the second time point, and configured to send the one or more control signals to the address decoder, wherein the address decoder is configured to float the ground selection line and the dummy word line in response to the one or more control signals while the erase voltage rises from the first level, and the second time point is later than the first time point.

27. The memory system of claim 26, wherein between the first time point and the third time point, the erase voltage continues to rise, the first voltage is supplied to the ground selection line between the first time point and the second time point, and the second voltage is supplied to the first dummy word line between the first time point and the third time point.

28. The memory system of claim 27, wherein the first memory cell string is connected to a first bit-line, the plurality of memory cell strings includes a second memory cell string that is connected to the first bit-line, and a second ground selection transistor included in the second memory cell string is connected to the ground selection line.

29. The memory system of claim 28, the address decoder configured to float a second dummy word line after the second time point, the second dummy word line being connected to the second dummy memory cell.

30. The memory system of claim 29, wherein the erase voltage is maintained at a target level from a fourth time point that is later than the third time point.

* * * * *